United States Patent [19]
Childs et al.

[11] Patent Number: 5,250,943
[45] Date of Patent: Oct. 5, 1993

[54] GVT-NET—A GLOBAL VIRTUAL TIME CALCULATION APPARATUS FOR MULTI-STAGE NETWORKS

[75] Inventors: Philip L. Childs; Howard T. Olnowich, both of Endicott; Joseph F. Skovira, Binghamton, all of N.Y.

[73] Assignee: International Business Machines Corporation, Armonk, N.Y.

[21] Appl. No.: 748,295

[22] Filed: Aug. 21, 1991

Related U.S. Application Data

[63] Continuation-in-part of Ser. No. 677,543, Mar. 29, 1991.

[51] Int. Cl.[5] .................................... H04Q 11/04
[52] U.S. Cl. .............................. 340/825.8; 340/826; 370/60
[58] Field of Search ............ 340/825.8, 825.02, 826; 370/60, 60.1, 94.2, 94.3, 95.3, 58.1, 103; 375/107; 368/52, 55

[56] References Cited

U.S. PATENT DOCUMENTS

| | | | |
|---|---|---|---|
| 3,246,298 | 4/1966 | Schramel et al. | 340/172.5 |
| 3,268,866 | 8/1966 | Van't Slot et al. | 340/147 |
| 4,237,447 | 12/1980 | Clark | 340/147 T |
| 4,251,879 | 2/1981 | Clark | 370/60 |
| 4,307,378 | 12/1981 | Clark | 340/825.01 |
| 4,307,446 | 12/1981 | Barton et al. | 364/200 |
| 4,314,233 | 2/1982 | Clark | 340/825.02 |
| 4,475,188 | 10/1984 | Wilson et al. | 370/60 |
| 4,481,623 | 11/1984 | Clark | 370/60 |
| 4,482,996 | 11/1984 | Wilson et al. | 370/60 |
| 4,484,325 | 11/1984 | Wilson et al. | 370/60 |
| 4,518,960 | 5/1985 | Clark | 340/825.02 |
| 4,623,996 | 11/1986 | McMillen | 370/60 |
| 4,701,906 | 10/1987 | Ransom et al. | 370/60 |
| 4,706,080 | 11/1987 | Sincoskie | 340/825.02 |
| 4,754,395 | 6/1988 | Weisshaar et al. | 364/200 |
| 4,766,592 | 8/1988 | Baral et al. | 370/62 |
| 4,815,105 | 3/1989 | Bottoms et al. | 375/37 |
| 4,818,984 | 4/1989 | Chang et al. | 340/825.54 |
| 4,835,674 | 5/1989 | Collins et al. | 364/200 |
| 4,855,899 | 8/1989 | Presant | 364/200 |
| 4,897,834 | 1/1990 | Peterson et al. | 370/85.1 |
| 4,926,375 | 5/1990 | Mercer et al. | 364/900 |
| 4,935,866 | 6/1990 | Sauvajol et al. | 364/200 |
| 4,941,084 | 7/1990 | Terada et al. | 364/200 |
| 4,952,930 | 8/1990 | Franaszek et al. | 340/825.80 |
| 4,956,772 | 9/1990 | Neches | 364/200 |

OTHER PUBLICATIONS

Lin et al. "Determining the Global Virtual Time in a Distributed Simulation 1990 International Conference on Parallel Processing"; pp. III-201-III-209.

Jefferson "Virtual Time" ACM Transactions on Programming Languages and Systems; vol. 7, No. 3, Jul. 1985 pp. 404-425.

IBM TDB vol. 30, No. 1, Jan. 1987 pp. 72-78, Pol Actuated Multiple Access Technique for Broadgathering Systems.

IBM TDB vol. 22, No. 12, May 1980 pp. 5450-5452, Distributed Star Network with Unrooted Tree Topology.

IEEE Trans. Computers C-32, 175-189 (Feb. 1983), NYU Ultracomputer Gottlieb et al.

IBM Research Parallel Processor Prototype "Proceedings of 1985 International Conference on Parallel Processing", pp. 764-769.

Primary Examiner—Donald J. Yusko
Assistant Examiner—Michael Horabik
Attorney, Agent, or Firm—Lynn L. Augspurger; Eugene I. Shkurko

[57] ABSTRACT

A GVT-NET apparatus for all processor nodes of a parallel system for repetitive calculation of the latest global virtual time (GVT) value quickly and accurately over the communication multi-stage network (NET) that normally transmits data between nodes as point-to-point communications, broadcast, multi-cast, or multi-sender transfers. For multi-processor synchronization, each processing node can free-run and keep track of its local time and synchronize with the other processors by polling all processors to determine the minimal of the individual local times and indicate how far the entire job has progressed. The multi-sender and multi-cast functions in the multi-stage network enable every node attached to the multi-stage network to participate in one common and simultaneous GVT calculation, where each processor node can simultaneously transmit the inverse of its local time to the network and at the same time monitor the network output. Through one joint network transfer, all processor nodes can work together to determine GVT (which local time is lowest). Each processor node compares the inverse local time value sent to the network to the composite OR value received back from the network, and takes itself out of the calculation if the values do not compare by transmitting all zeroes in place of its inverse local time. All processor nodes can store it (inverted) immediately to get the latest copy of GVT.

29 Claims, 28 Drawing Sheets

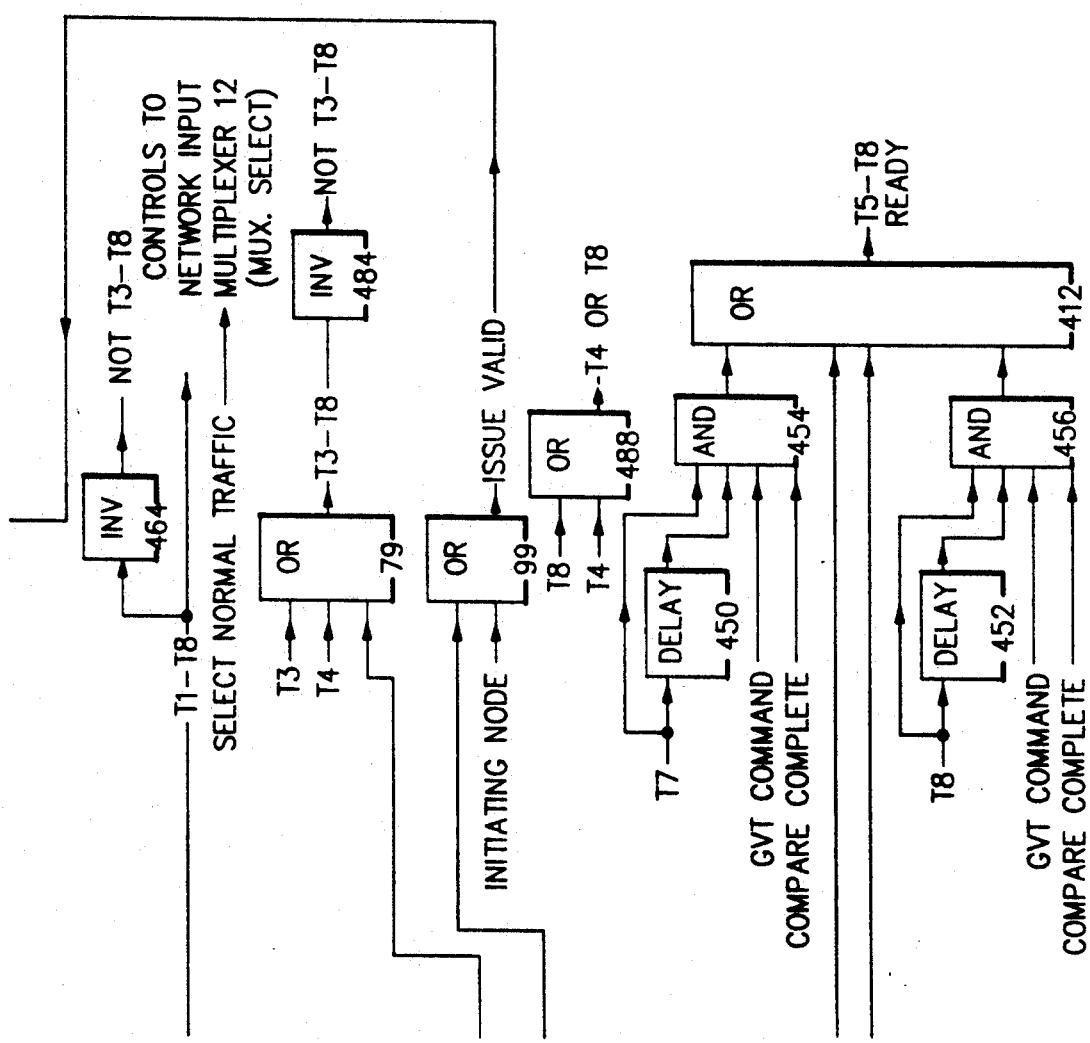

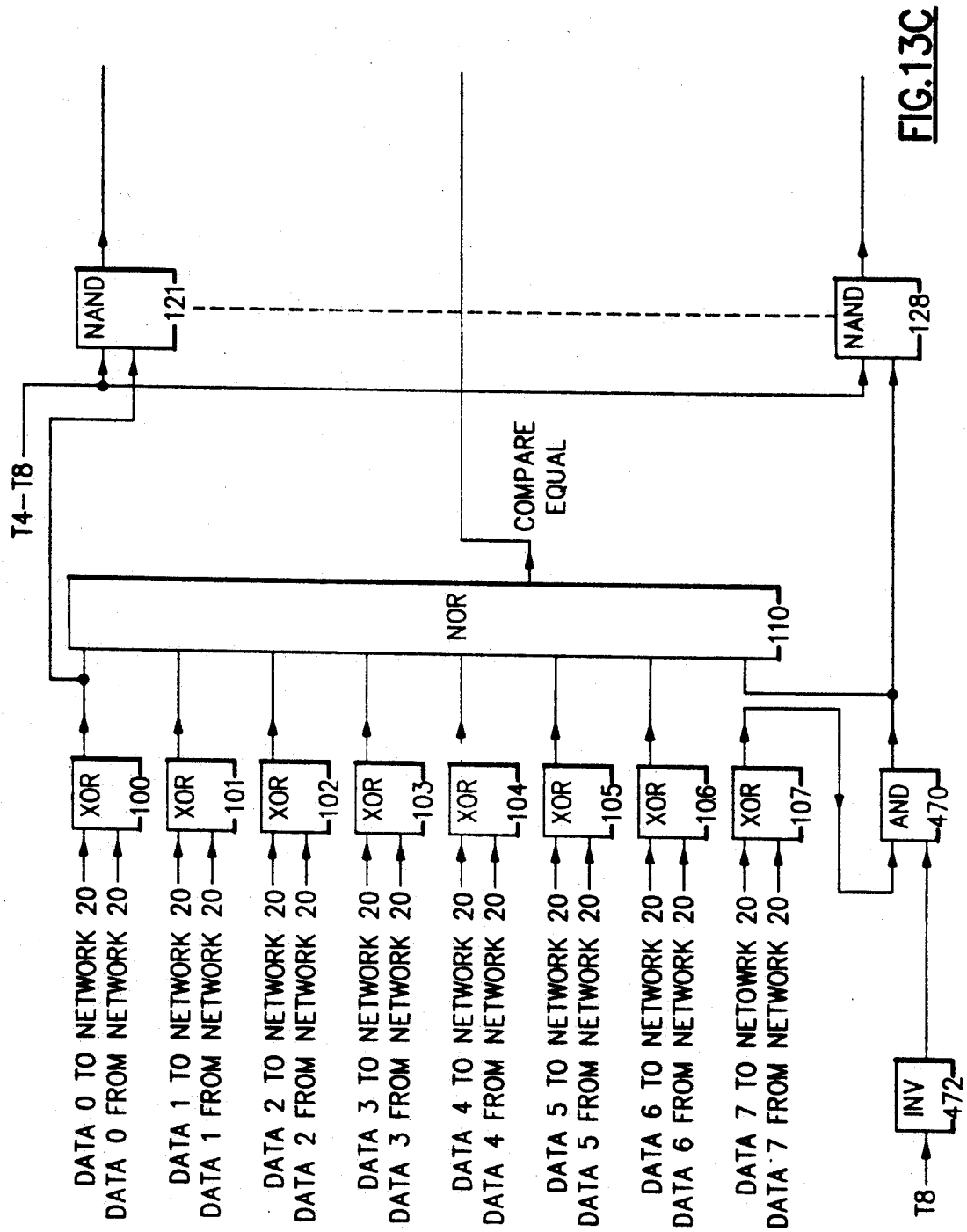

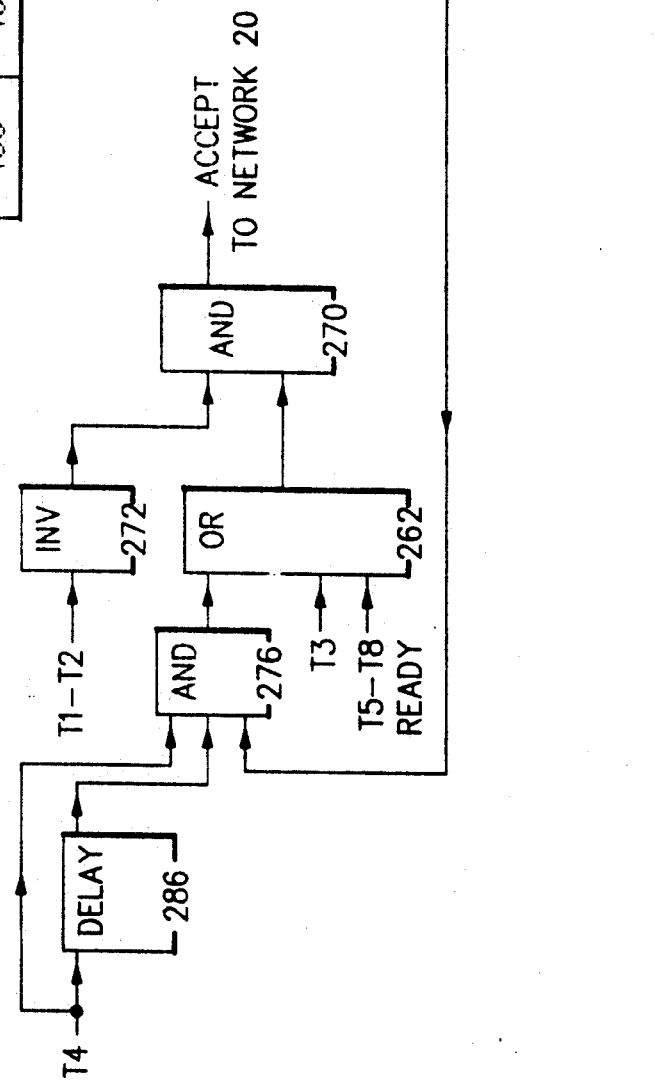

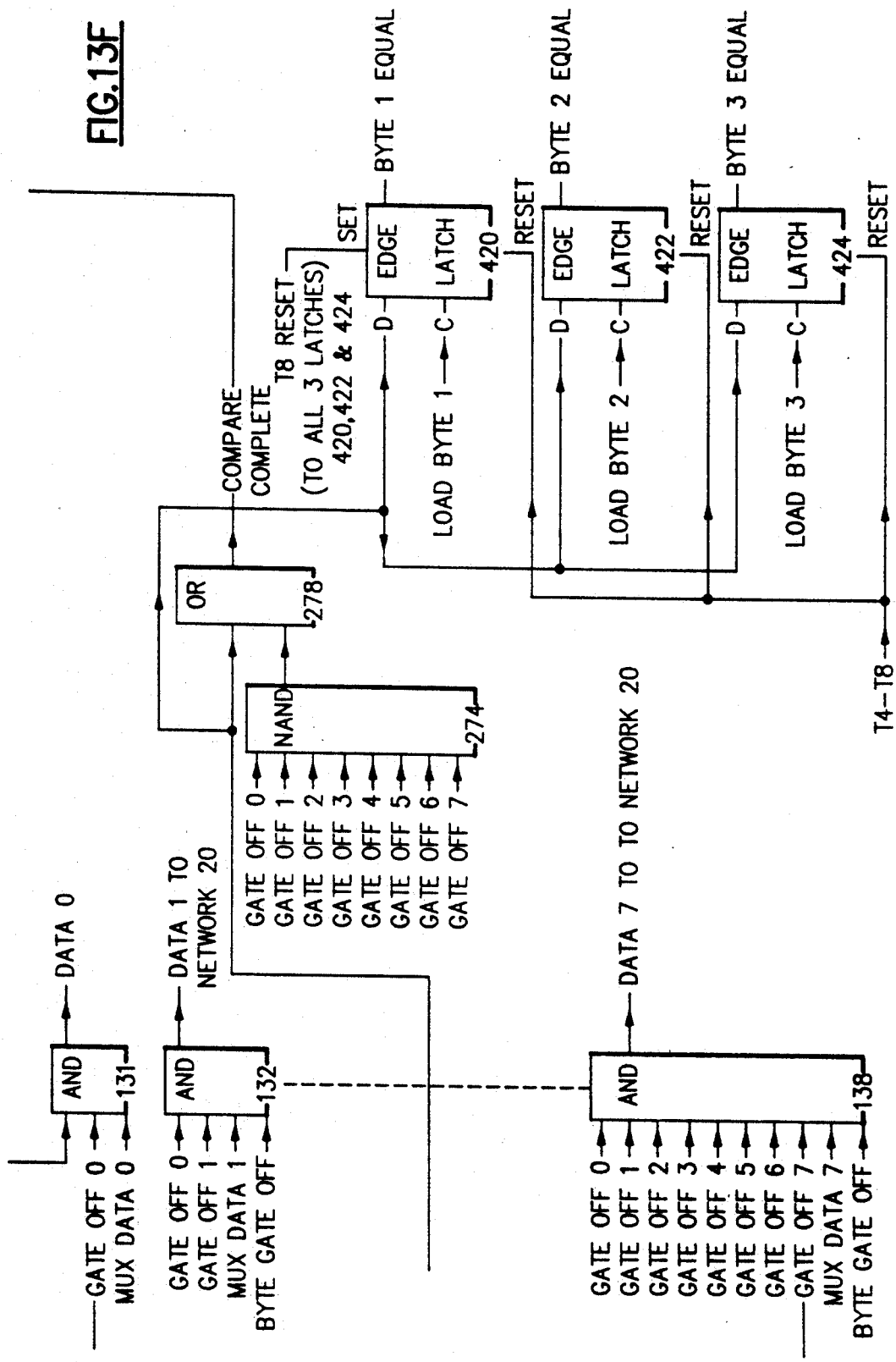

GVT-NET—A GLOBAL VIRTUAL TIME CALCULATION APPARATUS FOR MULTI-STAGE NETWORKS

RELATED APPLICATIONS

The present U.S. patent application claims priority and is related to the following application of which this is a continuation-in-part: U.S. Ser. No. 07/677,543, filed Mar. 29, 1991 entitled "ALLNODE SWITCH—AN UNCLOCKED, UNBUFFERED, ASYNCHRONOUS, SWITCHING APPARATUS"; Lusch et al.

The present U.S. patent application is also related to the following U.S. patent applications filed concurrently herewith.

U.S. Ser. No. 07/748,316, filed Aug. 21, 1991 entitled "BROADCAST/SWITCHING APPARATUS FOR EXECUTING BROADCAST/MULTI-CAST TRANSFERS OVER UNBUFFERED ASYNCHRONOUS SWITCHING NETWORKS"; Olnowich et al.

U.S. Ser. No. 07/748,302, filed Aug. 21, 1991 entitled "MULTI-SENDER/SWITCHING APPARATUS FOR STATUS REPORTING OVER UNBUFFERED ASYNCHRONOUS MULTI-STAGE NETWORKS"; Olnowich et al.

U.S. Ser. No. 07/748,303, filed Aug. 21, 1991 entitled "SYNC-NET—A BARRIER SYNCHRONIZATION APPARATUS FOR MULTI-STAGE NETWORKS"; Olnowich et al.

These applications and the present application are owned by one and the same assignee, namely, International Business Machines Corporation of Armonk, N.Y.

The descriptions set forth in the previous application and the concurrently filed applications are hereby incorporated by reference.

FIELD OF THE INVENTIONS

This invention relates to the field of parallel and multi-processing and more specifically to the means of synchronizing multiple processors functioning asynchronously by calculating a parameter referred to as Global Virtual Time (GVT). The invention further relates to a hardware mechanism implemented for use over a special function multi-stage network which has the capability to greatly enhance the speed and efficiency of the calculation of the GVT parameter. The invention further relates to unbuffered, asynchronous, multi-stage switching networks, and particularly to byte wide parallel crossbar switches for a multi-sized interface switch for supporting network operations involving multiple sending elements concurrently and jointly participating in a single co-ordinated GVT calculation over the multi-staged switching network.

BACKGROUND OF THE INVENTIONS

In the field of parallel processing, the synchronization of many processors working on the same task is an important consideration. If not done efficiently, the synchronization task can over-burden the communication network and greatly reduce the effectiveness of parallel processing or add excessive cost.

One synchronization approach discussed widely in the literature is Global Virtual Time (GVT). In this approach, each processing node can be allowed to free-run and can keep track of its own local time and synchronize with the other processors on-demand. With GVT, the method used to synchronize is to request the local time of all processing nodes and to determine the minimal of those times, which is defined as GVT and indicates how far the entire job has progressed. Without GVT, an individual node would have no idea how far the other nodes had progressed and would be swamped with the amount of data it would have to maintain. Through GVT the idea is to make it possible for all the nodes to remain in loose synchronization and to destroy all old data (which is time-stamped) at times less than GVT.

It is important to handle synchronization techniques, such as GVT, efficiently in parallel systems because they can add a large overhead to parallel operations and negate the effect of the parallelism. This disclosure presents a new and extremely rapid method of synchronizing by using GVT involving all nodes simultaneously in a single operation which occurs over the normal multi-stage interconnection network.

SUMMARY OF THE INVENTION

The present application provides a solution applicable to performing Global Virtual Time (GVT) calculations over switching networks in addition to the standard network interconnections such as point-to-point, broadcast, and multi-cast transfers. The present invention describes this new, rapid, and unique means of synchronizing over multi-sender operations which are special capabilities such as performing multi-sender operations which are defined as the ability of all or multiple elements attached to the network to transmit and participate simultaneously in the same network operation on a joint basis, as disclosed in U.S. Ser. No. 07/748,302, filed Aug. 21, 1991 entitled "MULTI-SENDER/SWITCHING APPARATUS FOR STATUS REPORTING OVER UNBUFFERED ASYNCHRONOUS MULTI-STAGE NETWORKS".

Our solution not only makes the GVT calculations easy to execute over unbuffered asynchronous networks but also provides the capability to perform the GVT calculations faster than any known method by many orders of magnitude. The combination of the multi-sender and multi-cast functions in the multi-stage network provides a means whereby every node attached to the multi-stage network can participate in one common and simultaneous GVT calculation and whereby each processor node can simultaneously transmit its local time to the network and at the same time monitor the network output—which is the logical OR of the local times from all processor processor nodes. Through this one joint transfer of the network, all processor nodes can work together to determine GVT (which local time is lowest).

The present invention, referred to as GVT-NET, is also predicated on the basic unbuffered asynchronous switch described in U.S. Ser. No. 07/677,543, filed Mar. 29, 1991, entitled "Allnode Switch—an unclocked, unbuffered, asynchronous, switching apparatus" and the broadcast extension of the switch described in U.S. Ser. No. 07/748,316, filed Aug. 21, 1991 entitled "BROADCAST/SWITCHING APPARATUS FOR EXECUTING BROADCAST/MULTI-CAST TRANSFERS OVER UNBUFFERED ASYNCHRONOUS SWITCHING NETWORKS".

The present invention is capable of performing priority driven arbitration processes over the network to resolve conflicts amongst multiple processing nodes simultaneously requesting the use of multi-stage network for the purpose of performing GVT or other multi-sender operations over the network. Since the special capability multi-stage network can support only one GVT calculation or other multi-sender operation at any given time, there must occur a priority arbitration to resolve which operation gets performed first, which gets performed next, and so on. Thus, the present invention provides the means whereby any number of processor nodes can arbitrate simultaneously for use of the network multi-sender facilities, and the arbitration will be resolved quickly and consistently by selecting the highest priority requestor. The priority resolution means involves the joint and simultaneous participation by all requesting processor nodes and the multi-stage network in one common operation.

The multi-stage network can perform the distributed arbitration function heretofore known only to multi-drop bus communication systems, such as the IBM Microchannel as described in the IBM Hardware Technical Reference for the Microchannel Architecture (IBM Publication SA23-2647-00), where each element places its arbitration level on the bus simultaneously. On the microchannel bus zeroes dominate over ones, and each sending element can read the bus to determine if the arbitration level it placed on the bus has dominated or not. The present invention is capable of performing the same type of arbitration operation over the multistage network, with the exception being that ones will dominate over the network instead of zeroes. The network implements multi-sender and broadcast operations simultaneously to perform the arbitration operation. Each processor node requesting use of the network sends its priority level to the network simultaneously as a multi-sender operation. The network logically ORs all the priority levels presented and returns the result to all processor nodes as a broadcast operation. Each processor node then compares the priority value it transmitted to the ORed value it receives back on a bit by bit basis. If the values are not the same the processing nodes drops out of the competition, it loses the competition, stops sending its priority level, and waits for the next competition. After a fixed time period all competitors will have withdrawn from the competition except for those having the highest priority level.

The winning node or nodes that have the highest priority level then own the network by virtue of the winning priority level they are transmitting. The term "priority level" has a dual meaning and is also interpreted as defining a specific command or multi-sender operation which is to be executed next. All processing nodes receive the bit pattern of the winning priority level (whether they are driving the bit pattern or not) and decode the pattern as a command. A GVT calculation request is defined as one specific command bit pattern that defines a particular type of multi-sender operation (namely the GVT command). The GVT command can be assigned as any bit pattern, but for discussion purposes assume that the all ones bit pattern shall be defined as meaning a GVT command. Since logical ones dominate over zeroes in the network, the all ones bit pattern assumed here to define the GVT command means that it is the highest priority command and that GVT will always win the use of the network first over any other multi-sender operations as defined by other bit patterns (other than all ones).

All processor nodes receive the selected GVT command simultaneously over the network and each responds by transmitting simultaneously with all other nodes the one's complement of its own local time to the network. This is referred to as a multi-sender operation, where all nodes transmit their information simultaneously. The network logically ORs all the individual local times on a bit by bit basis as they are sent to the network from all the nodes attached to the network. Since a logical one will dominate the OR function, any node which transmits a ONE to the network on a given data bit will cause the network output associated with that data bit to go to a ONE. Each processor node then compares the value it transmitted to the ORed value it receives back on a bit by bit basis. If the values are not the same, the processing node realizes that it does not have the lowest Local Time and it drops out of the competition, it loses the competition, stops sending its local time and waits for the GVT calculation to complete. After a fixed time period all competitors will have withdrawn from the competition except for those sending the highest one's complement value to the network. This value is the inverse of GVT (the lowest local time value across all nodes). Simultaneously, in broadcast fashion, the network sends the resulting inverse GVT to all processor nodes so that all the nodes invert the value coming from the network and know immediately the newly calculated GVT value. This completes the GVT operation leaving the network free to perform the next operations, which can be point-to-point transfers, broadcast or multi-cast operations, or other types of multi-sender operations.

In accordance with our inventions, we provide a hardware circuit for implementing the GVT calculation function which works equally well through one network stage or multiple cascaded network stages.

The GVT calculation apparatus has the ability to delay the network operation until all network paths become available and until all multi-senders have joined the operation. In addition, the invention apparatus has the capability of providing a positive feedback acknowledgement that it has made connections to all the commanded paths, and that all multi-senders have joined the operation and have transmitted their individual local time responses. This is provided uniquely for each stage of the network.

The GVT calculation apparatus also has the ability to handle local time and GVT values which are composed of more bits of information than are provided at any one time through the network interconnection paths. This is accomplished by dividing the GVT calculation of G bits into "C" sub-calculations over the network, where C=G/P and P=the bit width of the network. The GVT is still calculated in one network operation that is composed of C back-to-back sub-calculations.

Also, we have included the capability for allowing any processor node to request a GVT calculation by broadcasting the GVT command to the network. Several or many processor nodes can request a GVT calculation simultaneously by all transmitting the GVT command (all ones bit pattern) simultaneously. Such multiplicity is resolved instantaneously and consistently in one operation which satisfies all concurrent GVT requests. It is also possible for several or many processor nodes to simultaneously have identical lowest local time values, in which case the GVT calculation apparatus will still consistently pick the lowest value as the new GVT.

These features and other improvements are detailed in the following description. For a better understanding of the inventions and for a detailed background, together with related features, reference may be had to the previous allnode switch, broadcast/switch, and multi-sender switch applications. Specifically as to the improvements described herein, reference should be made to the following description and the below-described drawings.

It will be noted that certain of the FIGURES originally portrayed as one sheet drawings may be viewed as multi-sheet drawings as A, B, C or D.

DETAILED DESCRIPTION OF THE PREFERRED EMBODIMENTS

The preferred embodiment of the disclosed GVT-NET invention permits all processor nodes of a parallel system to synchronize over the communication multi-stage network that normally transmits data between nodes as point-to-point communications, broadcast, multi-cast, or multi-sender transmissions. The preferred embodiment assumes that the local time and GVT values used for synchronization purposes are 31-bit values and that the multi-stage network transmits data over byte-wide (8-bits) interconnection paths, Referring to FIG. 1, network 20 is a multi-processor interconnection network used to pass data and commands amongst "n" processor nodes referred to as 1, 30 to 40; where n can theoretically be any positive integer. To perform GVT calculation functions over network 20, the network must be composed of switch components which have specific characteristics, such as being unbuffered and having the ability to perform multi-sender and broadcast operations as disclosed in the co-pending applications referenced above bearing U.S. Ser. Nos. 07/677543, 07/748316, and 07/748302.

The present invention is capable of performing priority driven arbitration processes over the network 20 to resolve conflicts amongst multiple processors simultaneously requesting the use of network 20 to perform GVT calculations or other multi-sender operations. Since network 20 can support only one multi-sender operation at any given time, there must occur a priority arbitration to resolve which gets performed first, which gets performed next, and so on. Thus, the present invention provides the means whereby all n processor nodes 1, 30 to 40 can arbitrate simultaneously for use of the multi-sender facilities of network 20, and the arbitration will be resolved quickly and consistently by selecting the highest priority requestor or requestors. The priority resolution involves the joint and simultaneous participation by all n nodes and network 20 in one common operation.

Figure 1:
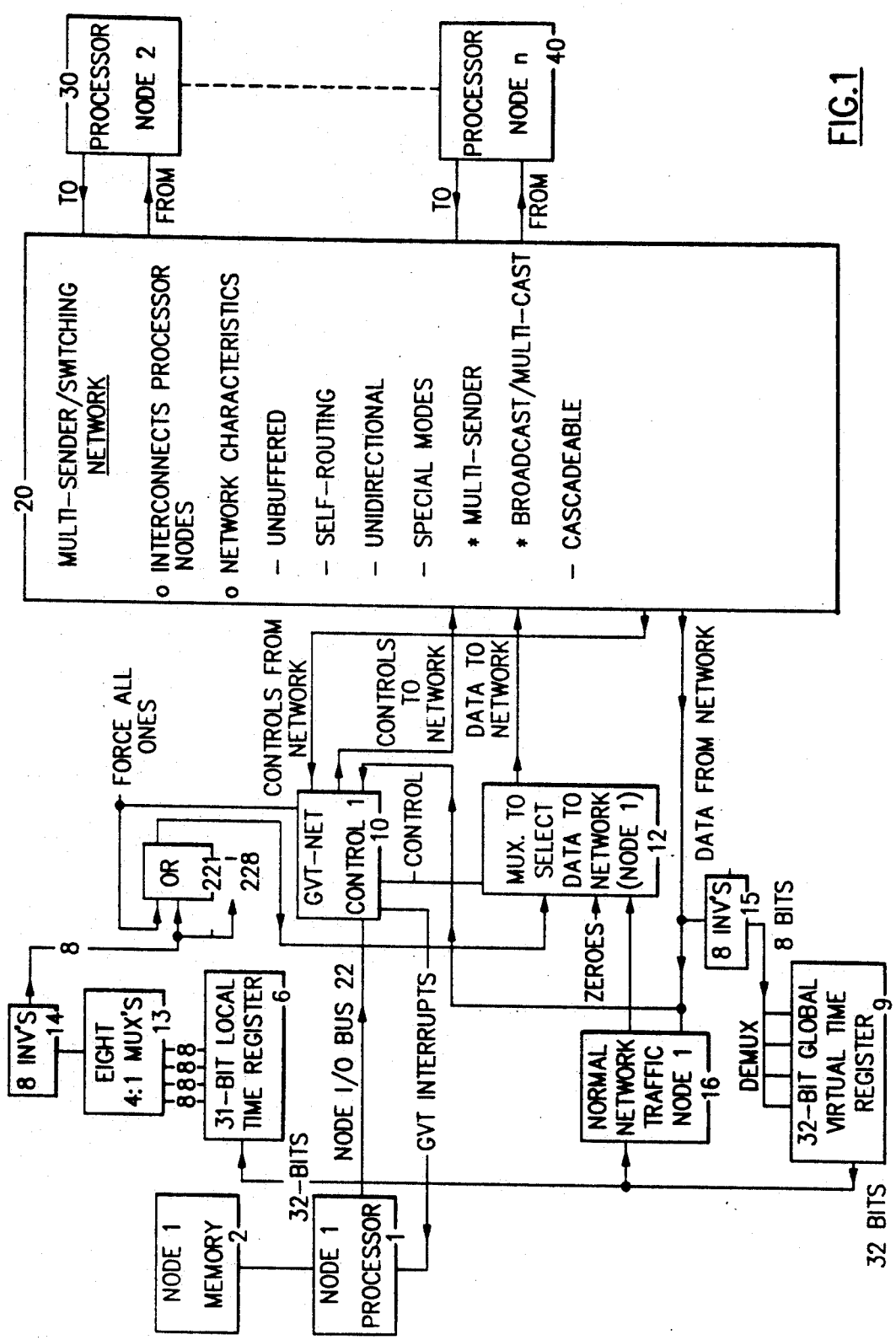
FIG. 1 illustrates generally the functional diagram of our preferred embodiment of the present invention as a hardware means implemented at each processing node and communicating jointly over a multi-stage network comprised of multi-sender/switching apparatus devices.

Referring to FIG. 1, blocks 6 through 15 show the major functional blocks required to implement GVT-NET at processor node 1; identical blocks are required at all n nodes to enable synchronization to occur amongst all n processor nodes. Block 6 is the 31-bit LOCAL TIME REGISTER which defines the unique asynchronous time that node processor 1 has presently advanced to in the execution of its parallel processing task. The LOCAL TIME REGISTER 6 is initially set to all zeroes and is advanced by the software of node 1 as it progresses through its tasks and transmits updated local time values to register 6 over the 32-bit NODE I/O BUS 22 (the high order bit from the NODE I/O BUS 22 is ignored and the low order 31-bits are loaded into register 6). Block 9 is the node 1 GVT Register which is also initially set to all zeroes. The GVT Register 9 then advances in synchronization with the other processor nodes as it is updated via GVT commands issued over the network so that it stores the minimum of all n LOCAL TIME REGISTERS at any given moment. Every node has an identical GVT Register 9, and all n GVT registers 9 are always updated simultaneously, and all contain identical values. This is unlike the LOCAL TIME REGISTERS 6 all of which most likely contain different values at any given moment.

Block 16 sends and receives normal message traffic over the network. Whereas, blocks 6 to 15 function together to control the GVT-NET operation and to provide synchronization amongst the n processor nodes, the main function of GVT-NET is to find the minimum of all n LOCAL TIME REGISTERS 6 at any moment by searching all n processor nodes over network 20 and by then causing the lowest local time value to be loaded as the newly calculated GVT into all n GVT REGISTERS 9 simultaneously. This operation is accomplished completely in one 8-step operation over the network that normally requires less than 1 $\mu$ (usec) to execute. A GVT calculation can be initiated from any processor node by the local processor 1 or other special purpose hardware.

The hardware required at each node to implement the GVT operation is the Local Time Register 6 which gets multiplexed down to four bytes through eight 4:1 Multiplexers 13 and inverted by inverters 14 for transmission through OR gates 221 to 228 and multiplexer 12 to network 20, where it is compared to the inverses of all other local time Registers 6 from the other nodes attached to the network. The comparison looks for the highest inverse local time value (which is the lowest local time value) amongst all nodes. The lowest value is returned as GVT on network 20 to all n nodes simultaneously, where it is inverted by inverters 15, demuxed, and stored as the new GVT value in GVT register 9. The new GVT value can then be read by the local processor node 1 over NODE I/O BUS 22. (The high order bit from the NODE I/O BUS 22 is ignored and the low order 31-bits are read by the node processor 1).

Figure 2:
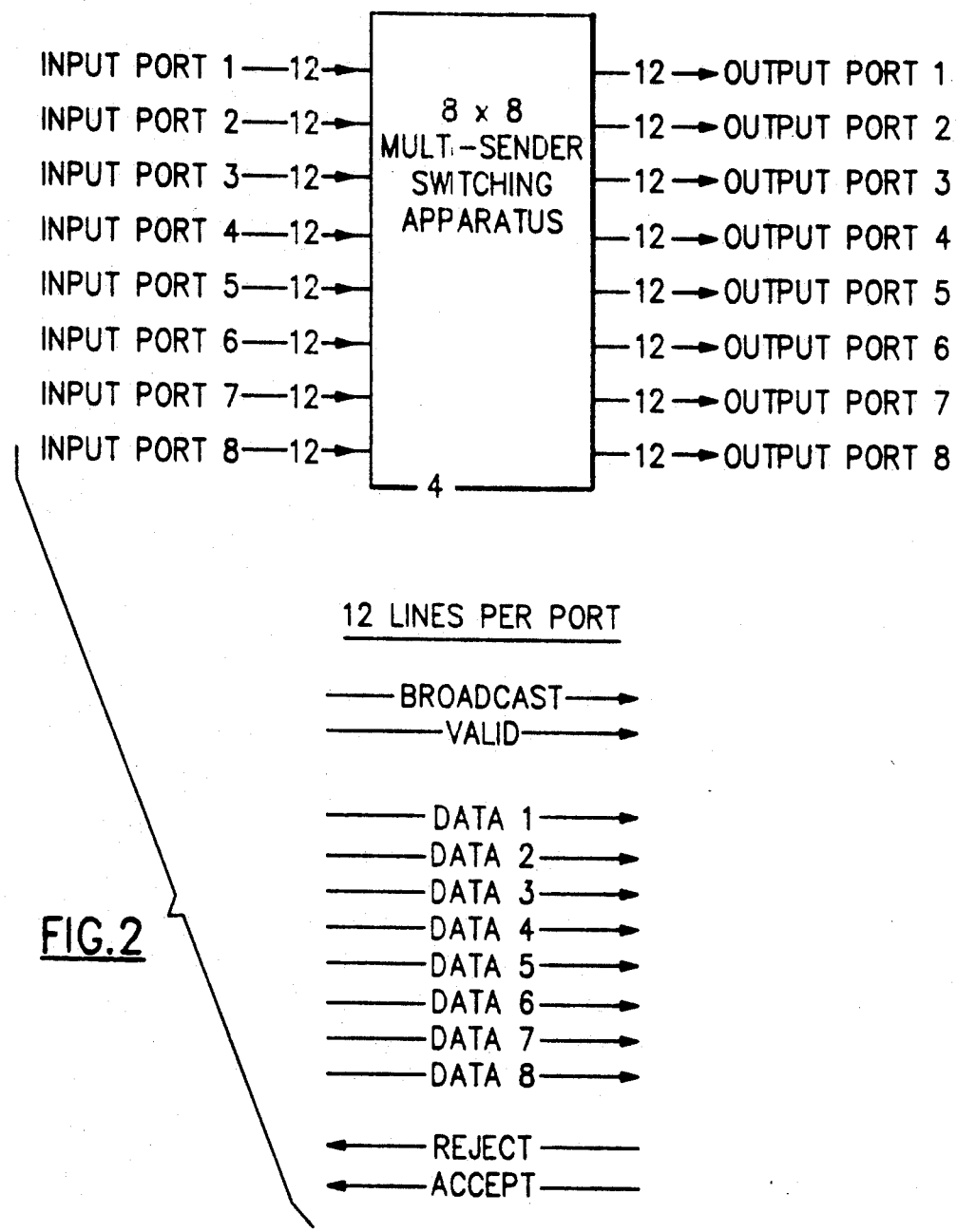
FIG. 2 illustrates the detailed input and output port interfaces of the 8×8 crossbar, multi-sender/switching apparatus which comprises the multi-stage network.

GVT-NET Control block 10 receives requests from the local node processor 1 over the NODE I/O BUS 22 requesting that a GVT calculation be executed. Control block 10 starts the processing of a GVT calculation by activating its interface to the network and stepping through the 8-step GVT operation sequentially. The interface that every node has to the network is the interface to and from the Multi-sender/switching apparatus 4 comprising network 20 as shown in FIG. 2. Actually, this interface is unidirectional so every node really has two such interfaces with the network—one going to the network and one coming from the network. Control block 10 initiates a GVT transfer by activating its VALID and BRDCAST lines to the network and indicating it wants to connect simultaneously to all nodes by transmitting a broadcast command.

The network 20 then works on establishing connection to all n nodes. This is accomplished on a switch by switch basis until all stages of the network have been traversed and all n nodes are connected via the network. The method of accomplishing the broadcast connection through the network 20 is described in the application referenced as EN9-91-030A and is usually established in 500 ns or less.

Once the broadcast connection is totally established, the network informs Control block 10 by activating the ACCEPT line of FIG. 2. Control block 10 then issues a multi-sender JOIN command to all nodes over the connections it has established in network 20. All nodes receive this command and join the operation as multi-senders; this process involves each node's individually sending path selection commands to the network 20 to establish network connections that tie them into the present operation as multi-senders being ORed into the present broadcast connections. The process of establishing multi-sender network connections is described in detail in disclosure EN9-91-030B. In response to receiving the multi-sender JOIN command, each node joins the operation started by the initiating node.

Once the multi-sender network connections have been established, the GVT command is sent over network 20, and the GVT calculation using the network begins. It is possible that one, several, or many of the multi-sender nodes can issue a GVT command over network 20 simultaneously. This is a legal occurrence. The GVT-NET will resolve the single or multiple command issue with one consistent response—all n processors become connected in the multi-sender and broadcast mode for the purpose of performing one GVT command to satisfy all the simultaneous requests or one unique request, whatever the case may be.

Figure 3:
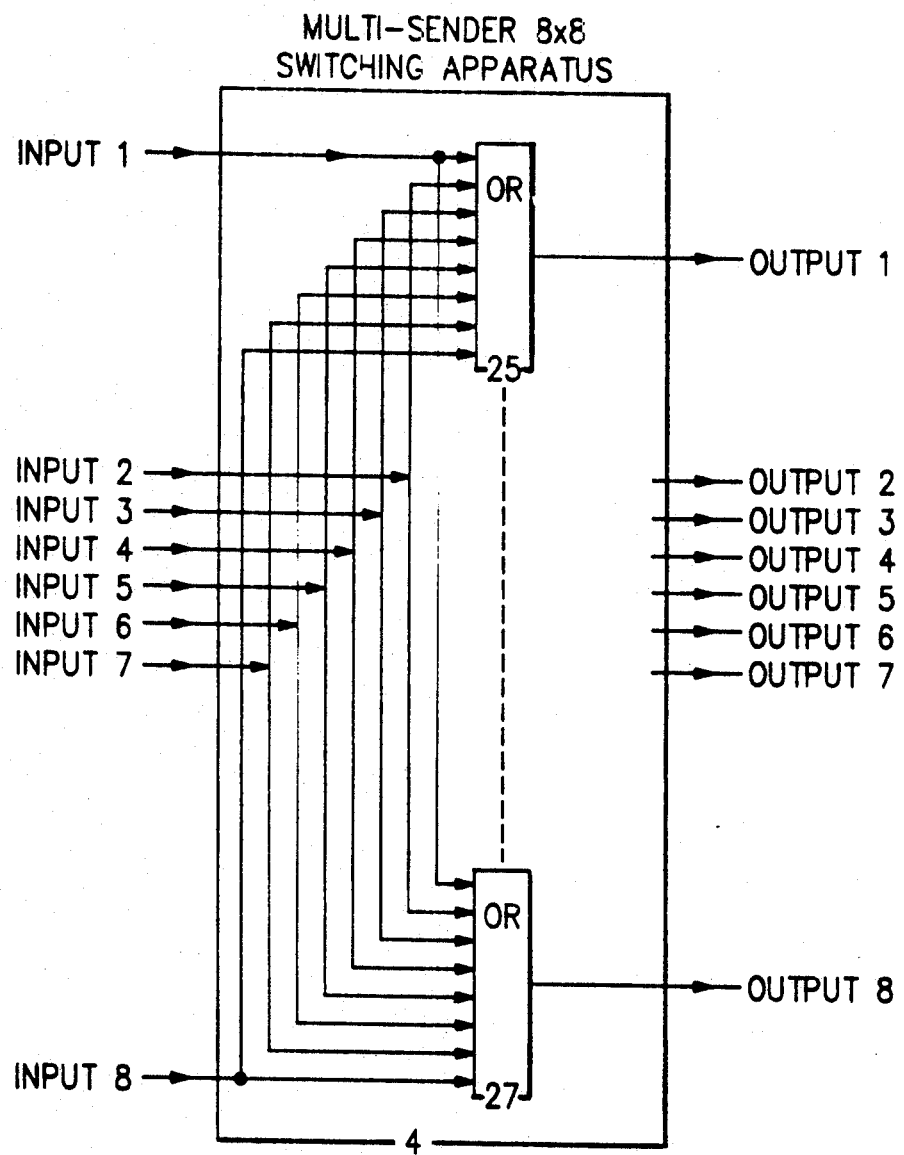
FIG. 3 illustrates the input ORing function provided by the multi-sender/switching apparatus and the network it comprises. Illustrated is how each apparatus logically ORs eight inputs and sends the same result to all eight outputs.

Being connected in multi-sender and broadcast mode means that connections from every node to network 20 are all logically ORed together and provide identical data on every connection from the network back to all n nodes, as shown in FIG. 3. A typical stage of network 20 is shown by block 4, which is a multi-sender/switching apparatus as described in application EN9-91-030B and is implemented as an 8×8 asynchronous, unbuffered crossbar switch which is capable of connecting any of 8 inputs to any of eight outputs. OR gates 25 and 27 show how the apparatus 4 individually ORs all eight inputs and transmits the OR of the inputs to all 8 outputs such that all eight outputs see exactly the same value (the OR of the corresponding eight inputs). FIG. 3 illustrates how the OR function works for a single individual line coming from eight inputs and going to eight outputs. In reality, the apparatus 4 handles a total of eight parallel information carrying data lines coming from each input and going to each output (byte wide paths). Each of the eight paths are implemented internal to apparatus 4 in the exact same manner as shown for the single lines; i.e., each of the eight lines has its own unique set of eight OR gates (like 25 27), which OR a corresponding set of eight input lines (one coming from each of 8 inputs and going to a specific output). The result is that each apparatus 4 performs a total of eight different OR functions simultaneously and fans the result out to eight outputs which all see the eight OR values simultaneously. Note that the broadcast function totally uses all 8n data interface lines to network 20 and all 8n data interface lines from network 20.

Figure 4A:
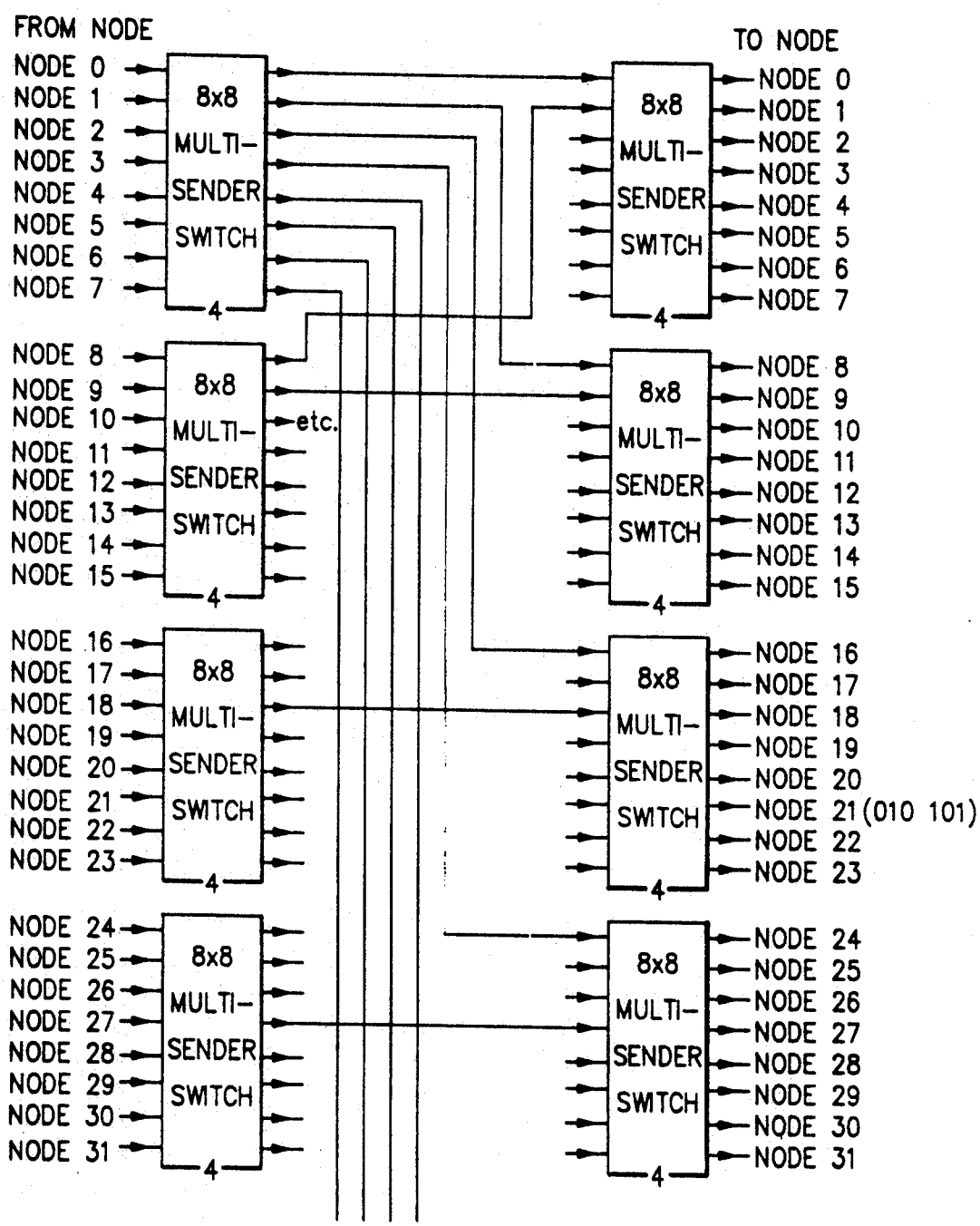
FIG. 4 shows a typical method for cascading the preferred 8×8 embodiment of the invention multi-sender/switching apparatus to accommodate systems having more than eight processing nodes.
Figures 4, 4A, 4B:
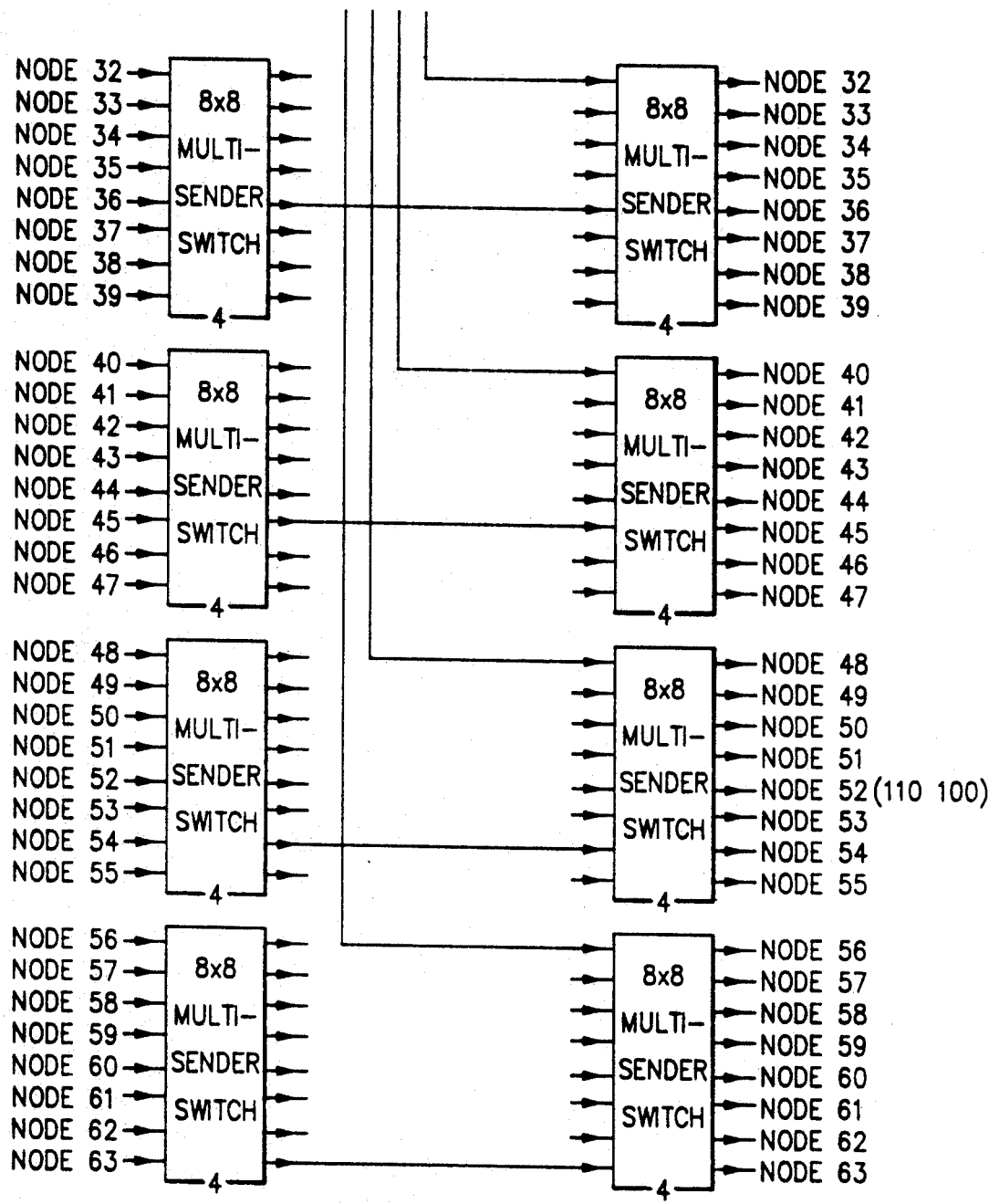

FIG. 4 shows how individual Multi-sender/switching apparatus 4 devices, like the one shown in FIG. 2, can be cascaded to increase the size of network 20 and to allow the connection to more than 8 nodes. Referring to FIG. 4, sixteen apparatus 4 devices can be interconnected as shown to provide a two-stage network 20 which permits total interconnection amongst up to 64 nodes. Theoretically, there is no limit to the number of network stages or the number of nodes serviced; however, our preferred embodiment shall refer to FIG. 4 as the typical implementation of network 20 which is described herein. The interfaces from each node are unique uni-directional and point-to-point wires that comprise the twelve signal lines (eight data and four control) shown by FIG. 2. The inputs to network 20 come from the left side of FIG. 4, where all 64 nodes interface to network 20—each interface using a unique set of the twelve signal lines. The outputs from network 20 come from the right side of FIG. 4, where network 20 sends data to all 64 nodes—each interface using a unique set of the twelve signal lines. Point-to-point wires between the two stages of multi-sender/ switching apparatus 4 devices enable any node to be connected through paths established in network 20 to any of the 64 nodes including itself.

Figure 5A:
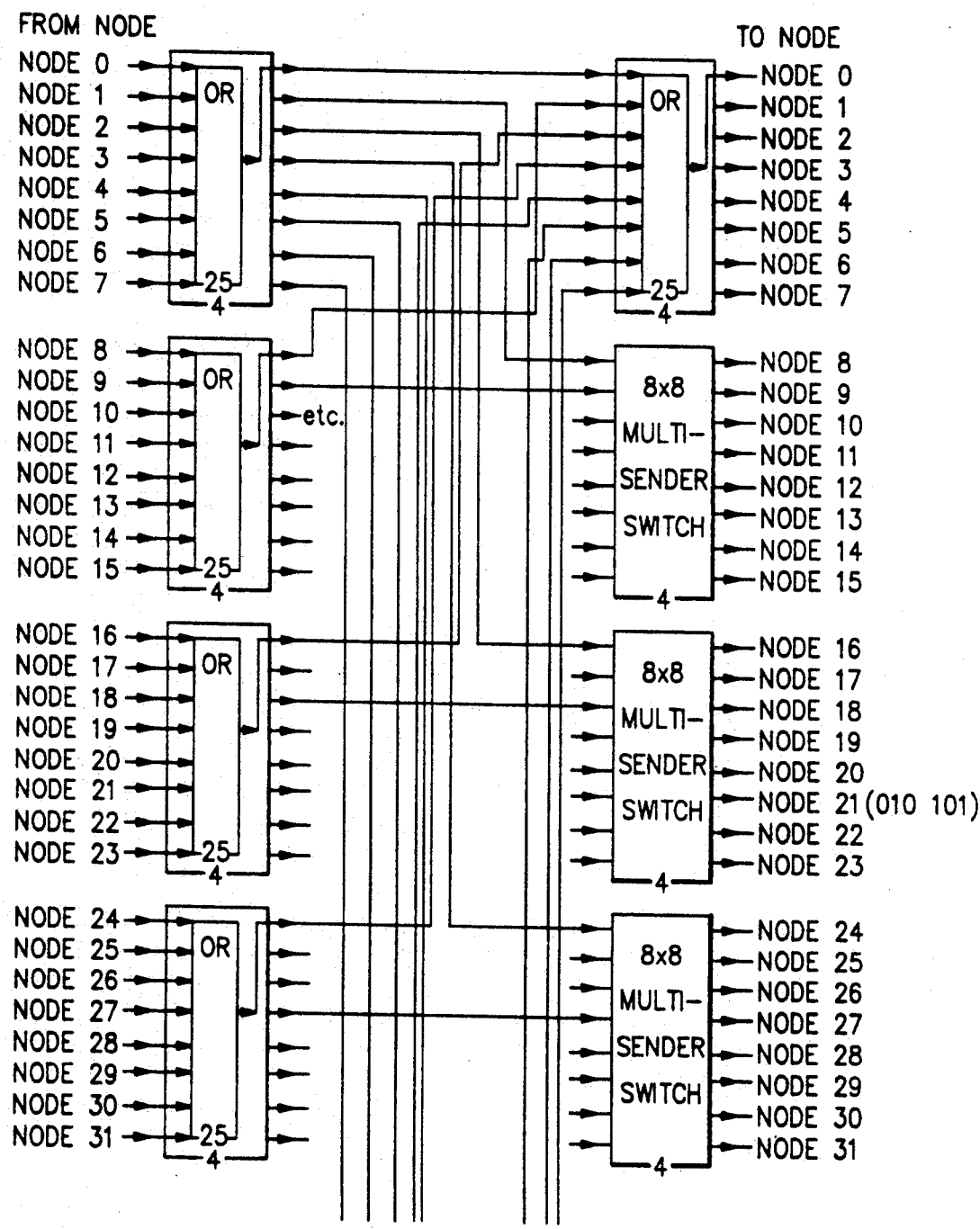
FIG. 5 shows how the network ORing function is cascaded across the stages of a multi-stage network as a means for ORing all 64 inputs and transmitting the result consistently and simultaneously to the desired nodes.
Figure 5B:
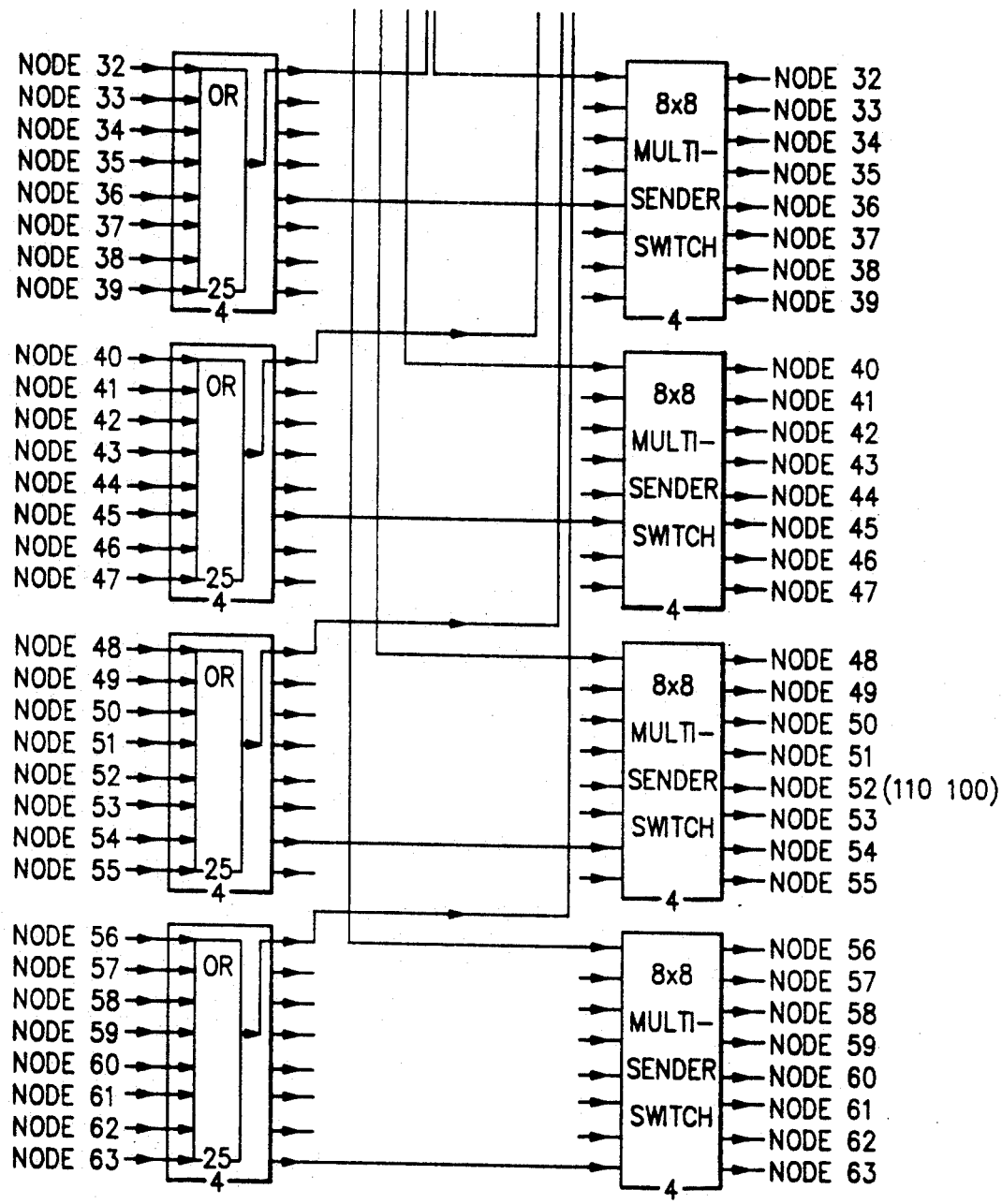

Referring to FIG. 5, a typical example is shown of how network 20 is capable of providing a means for extending the OR function associated with a single apparatus 4 device (as shown in FIG. 3) to encompass a cascaded OR function for the entire multi-stage network 20. The example in FIG. 5 shows how one data line from each of eight input ports can be ORed in each of eight apparatus 4 devices in the first stage of network 20 (shown on the left side of the figure) and how one line from each of the eight first stage apparatus 4 devices can be sent to each of eight apparatus 4 devices in the second stage (as illustrated by the top right second stage device), where the eight sets of eight ORed inputs are again ORed in the second stage to produce an output to node 0 which is the OR of the inputs from all 64 nodes as they enter network 20 from the left side of FIG. 5. In a similar manner to the way that node 0 receives the OR of all 64 inputs, all other nodes are capable of receiving the exact same 64-way OR function through network 20 simultaneously via 63 more OR 25 gates located in the second stage apparatus 4 devices (eight ORs per apparatus 4 as shown in FIG. 4). Also, this example only shows how 1 data line from each of 64 nodes can be ORed in network 20 and received by all 64 nodes; however, our invention supports eight data lines in and out of each node and apparatus 4 device. This means that in reality eight simultaneous 64-way OR functions are supported simultaneously in network 20 using a full 8-way parallel implementation as shown in FIG. 5. Network 20 supports simultaneously and individually the 64-way ORing and sending of eight unique lines at a time from and to all 64 nodes.

Figure 6:
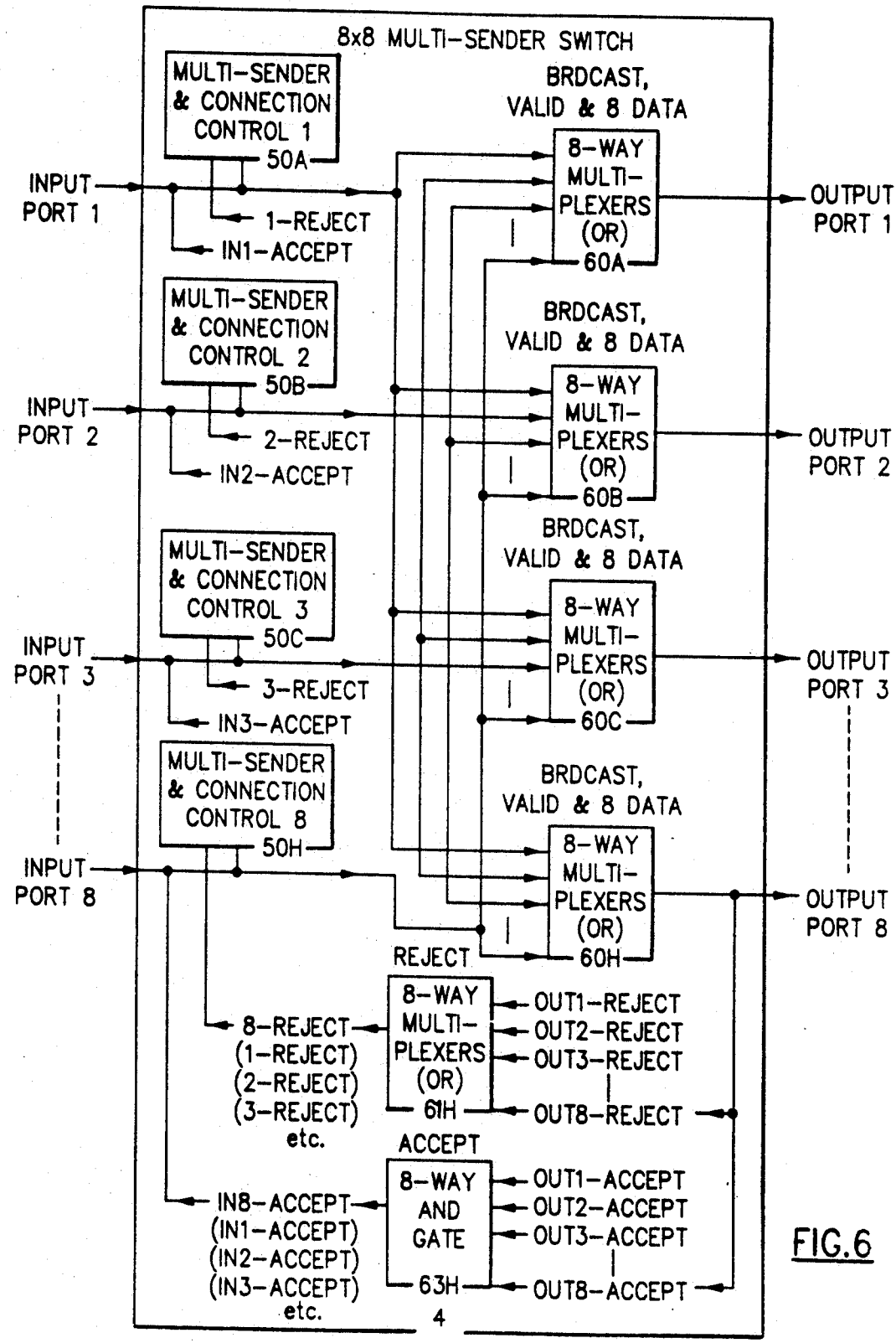
FIG. 6 shows a schematic block diagram of the simple data flow and control path implementations of the multi-sender/switching apparatus which comprises the network used for GVT calculations.

Referring to FIG. 6, a functional diagram of the simple data flow across each multi-sender switching apparatus 4 is illustrated. The BRDCAST, VALID, and 8 data lines at each input port, inside the multi-sender switch, and at each output port are represented by a single line in FIG. 6 for simplicity. For instance, the BRDCAST, VALID, and 8 data lines entering the multi-sender switch 4 at input port 1 go to 9 functional blocks internal to apparatus 4; these are blocks 50A, and 60A to 60H. Block 50A makes the decision about which of the eight possible output ports are to be connected to input port 1. The BRDCAST, VALID, and eight data lines from each input port go to each output multiplexer block (60A to 60H). This makes it possible to connect any input port to any output port. Each of the eight output multiplexer blocks (60A to 60H) implements the OR 25 function shown in FIG. 5 and is uniquely commanded from each of the eight control blocks (50A to 50H) about which of the input port lines are to be ORed to its output port. For instance, control block 50A can command multiplexer 60C to connect input port 1 to output port 3. Then control block 50B can command multiplexer 60A to connect input port 2 to output port 1, control block 50C can command multiplexers 60B and 60D to connect input port 3 in multi-cast fashion to output ports 2 and 4. Multiple connections like these are capable of being established simultaneously or at different times.

At the same time that multiplexers 60A to 60H form connections to move VALID, BRDCAST, and data signals across the multi-sender switch 4 with a unidirectional signal flow from input port to output port, multiplexer 61H and AND gate 63H (typical implementations are shown by blocks 61H and 63H—similar blocks are associated with each input port) form signal connections for the REJECT and ACCEPT signals, respectively, with a signal flow in the opposite direction of output port to input port. These REJECT and ACCEPT signals provide a positive feedback indication to multi-sender switch 4 of actions taken by later multi-sender switch 4 stages in a cascaded network 20 or by the node receiving the BRDCAST, VALID, and data signals. A command or message being transmitted through multi-sender switch apparatus 4 over the 8 data signals under control of the VALID signal can be REJECTED by any network stage if it is unable to establish the commanded connection, or by the receiving node if it is not capable of receiving the message currently, or if it detects an error in the transmission. The receiving node also has the capability of confirming the arrival of a message correctly (without errors being detected) by pulsing the ACCEPT signal. Since the REJECT and ACCEPT signals go in the opposite direction of the data flow, they provide a means of reporting back a positive indication to the sender whether the attempted message transmission was received correctly or rejected.

Figure 7A:
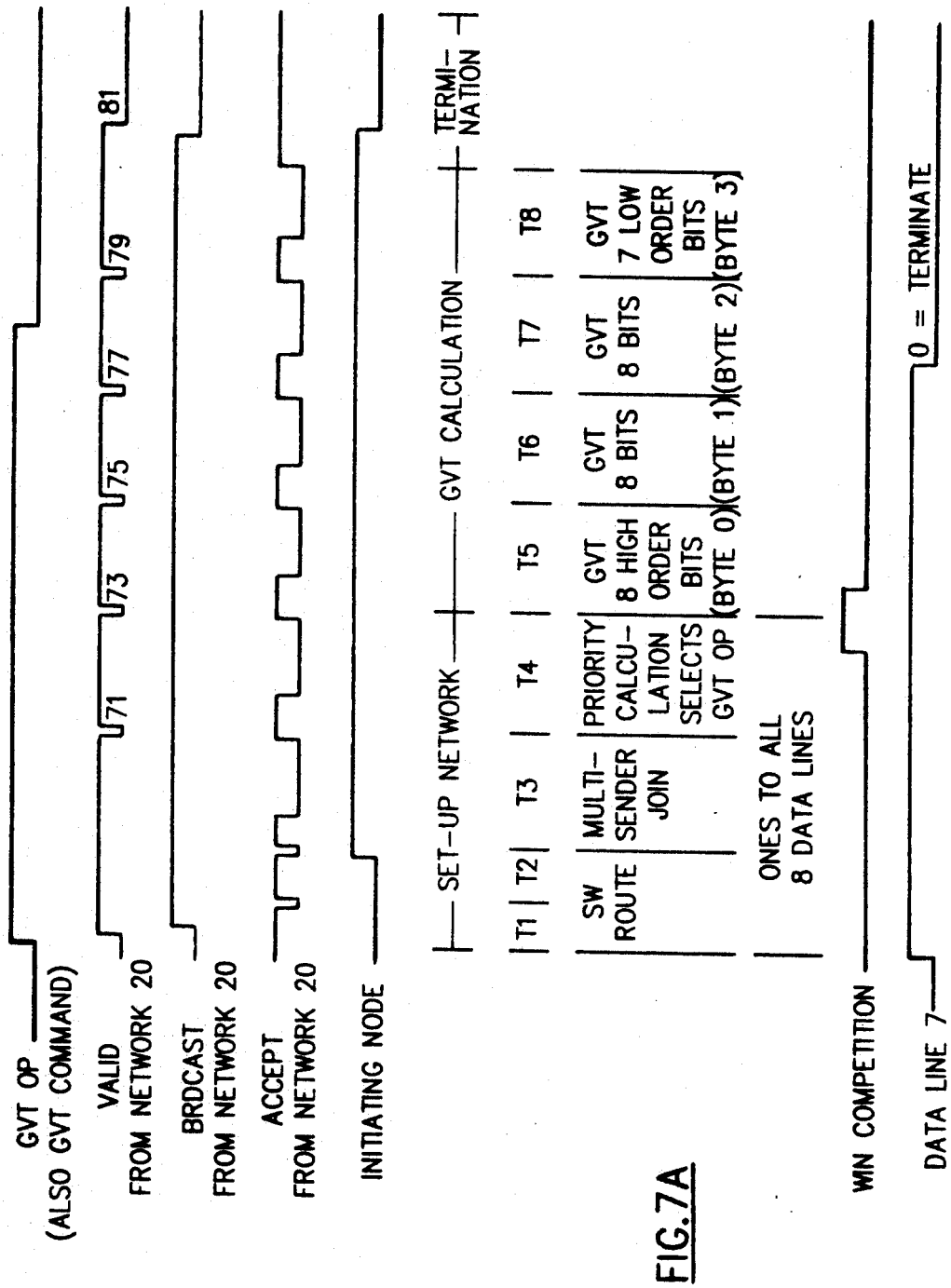
FIG. 7 illustrates a typical example of the GVT-NET timing and the sequential steps involved in executing a GVT calculation over the multi-stage network as related to the node which initiates the GVT request and command.
FIG. 7B illustrates a further typical example of the over-all timing of the GVT operation with pending requests for multi-sender operations and the initiating node maintaining all network 20 connections.
Figure 7B:
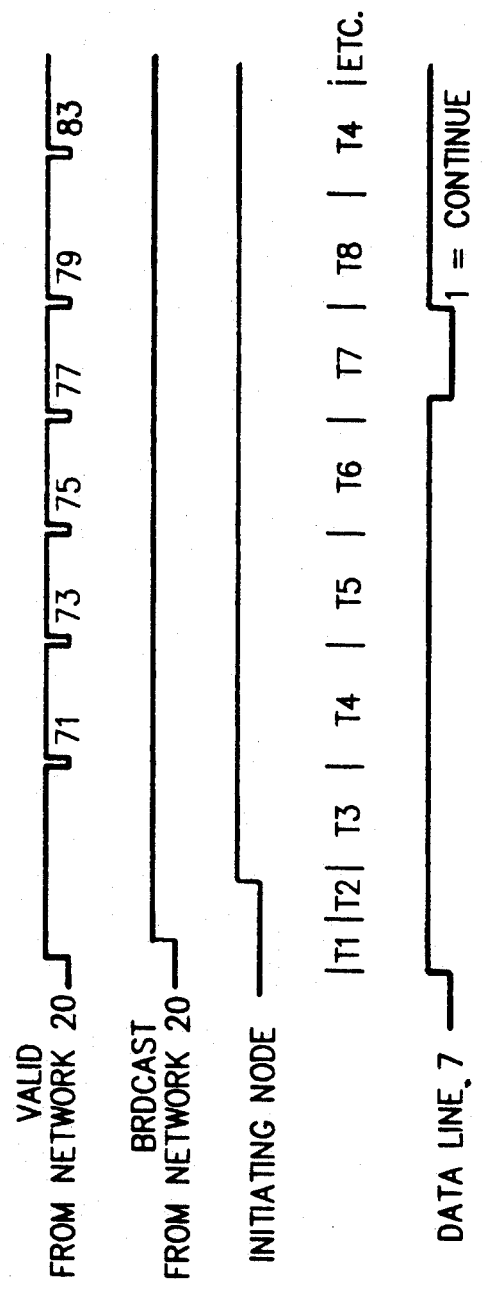
Figure 8A:
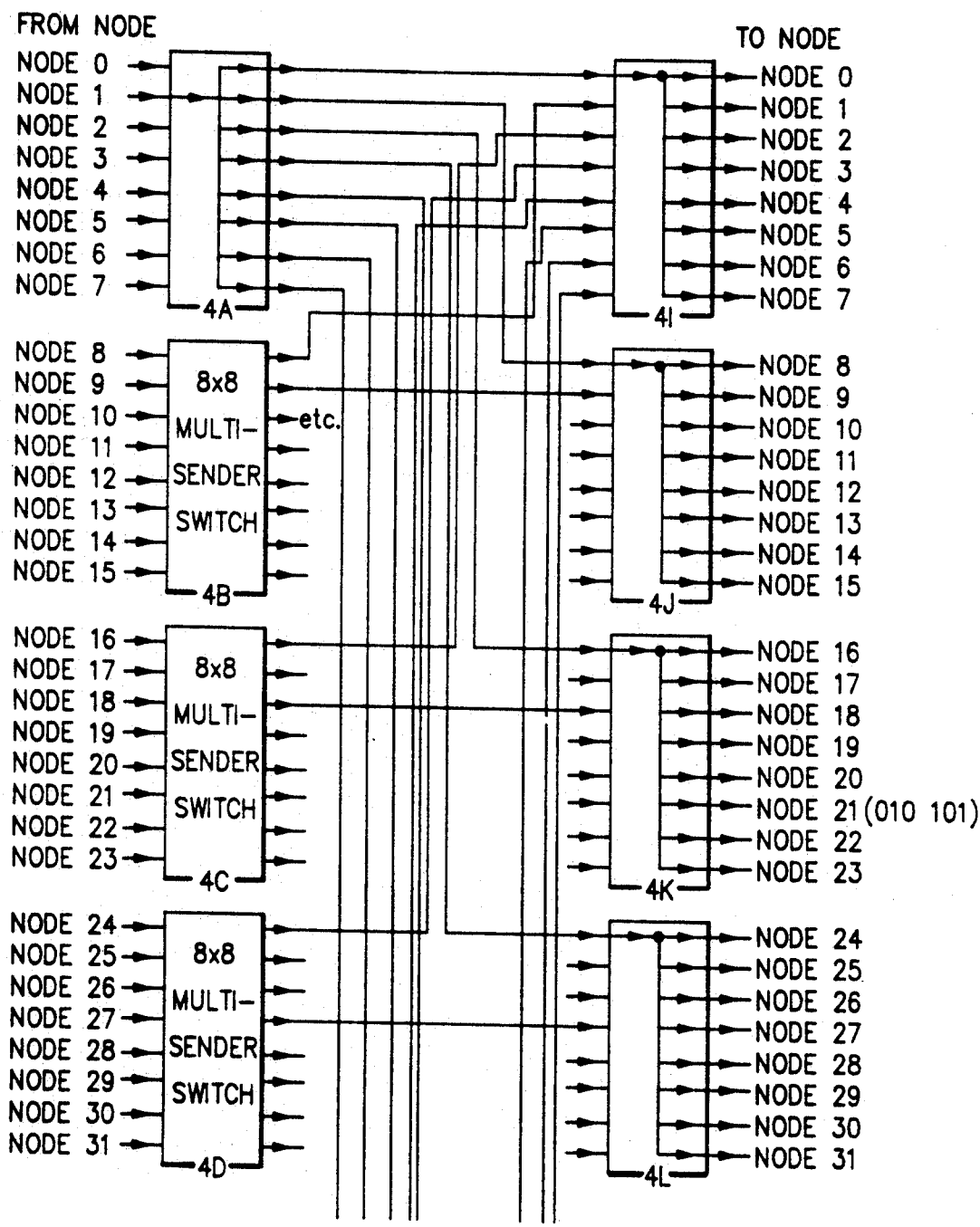
FIG. 8 illustrates a typical broadcast example and the connections established in each multi-sender/switching apparatus comprising a two-stage inter-connection network for connecting node 1 in broadcast fashion to all 64 nodes simultaneously.
Figures 8, 8A, 8B:
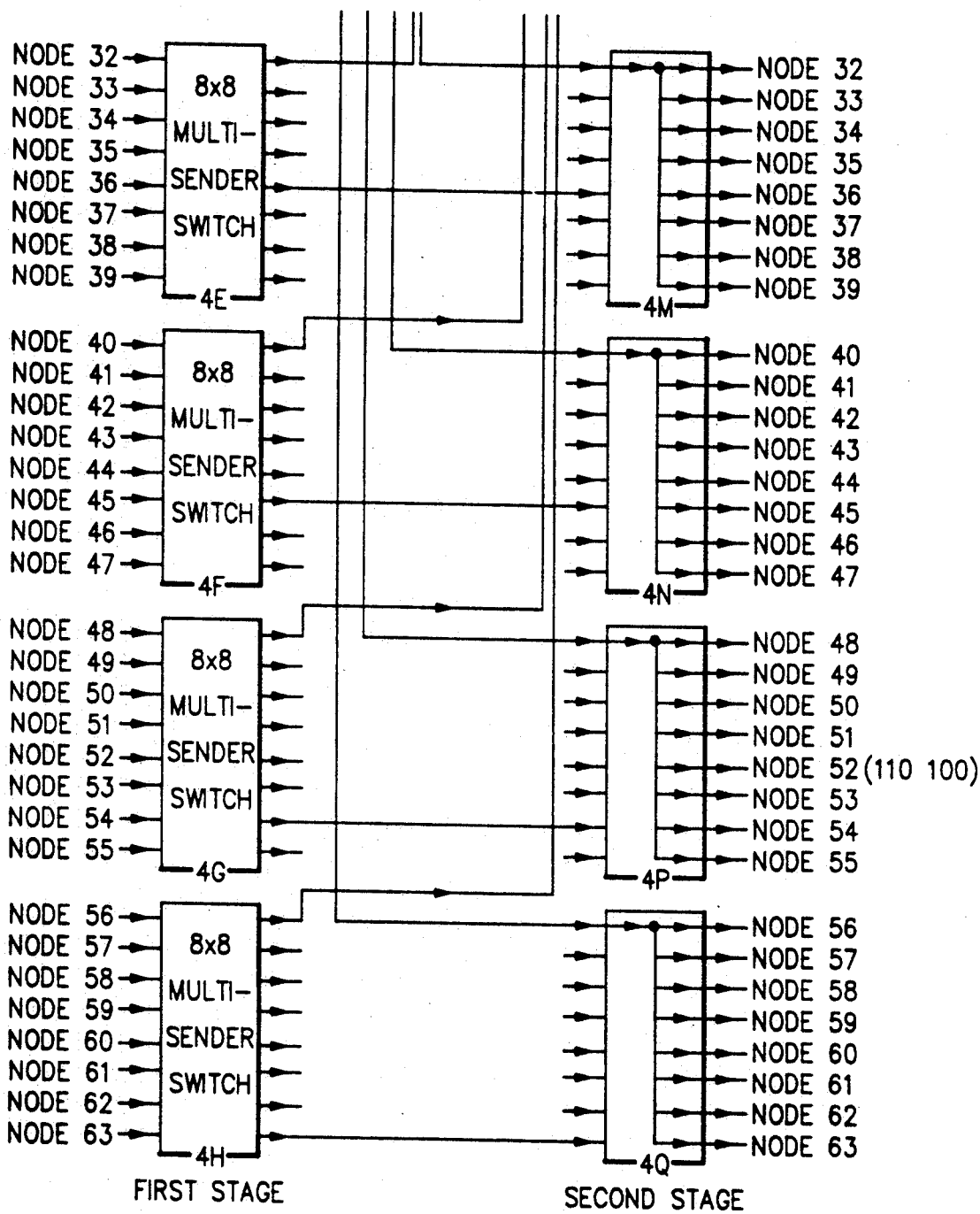

FIG. 7 shows an example of the over-all timing of the GVT operation as it is executed over the network 20 and initiated by a single node (node 1 for example). The GVT OP signal being set to a 1 indicates that node 1 has a pending GVT command to perform over the network 20. The GVT operation is a multi-sender operation that is initiated by establishing broadcast connections from an initiating node to all nodes. The example involves 8 sequential timing steps T1 to T8 generated by an operation control counter in GVT Control block 10 and assumes the two-stage 8-bit wide data network 20 shown in FIGS. 4 and 5. During T1 and T2, node 1 establishes broadcast connections to all n nodes through network 20 as shown in FIG. 8. The broadcast connections are established by making the eight stage 1 connections shown in FIG. 8 (block 4A) during T1 and the 64 stage 2 connections shown on the right side of FIG. 8 during T2. Node 1 establishes the broadcast connection to all nodes by issuing an all ones data pattern on the eight data lines it sends to the network for both times T1 and T2. The multi-sender/switch apparatus 4 devices comprising network 20 recognize all ones at each stage as defining the broadcast connection (node 1 being OR connected to all outputs internal to the involved apparatus 4 devices at both stages one and two of network 20). As each stage of the network successfully establishes the commanded broadcast connections within network 20, the applicable Multi-sender/switch apparatus 4 devices issue negative pulses on the ACCEPT signal back to node 1 to indicate the successful connection. Note that the ACCEPT signal defaults to the one state, so the signal must be driven negative and then back to positive to cause the ACCEPT signal to rise; it is the rise of the ACCEPT signal at node 1 that determines a positive feed-back indication of acceptance.

Node 1 uses the first rise of the ACCEPT line to step the operation control counter from T1 to T2 and the second rise step to T3, as shown in FIG. 7. If node 1 gets ACCEPT pulses returned at both T1 and T2, it knows that it is the initiating node and sets the INITIATING NODE signal with the concurrence of T2 and the rise of ACCEPT. Only one broadcast operation is allowed in network 20 at any given time so the very first broadcast operation to arrive at network 20 will receive two ACCEPT pulses. Any subsequent attempt to broadcast by another node after one broadcast is in progress in network 20 will receive a REJECT rather than an ACCEPT. Thus, two ACCEPT pulses (one for each stage of the network) indicate that the attempt to broadcast has been accepted, and if a multi-sender operation such as the GVT operation is to follow, indicates that the winner of the broadcast honors becomes the initiator of the multi-sender operation.

Figure 11A:
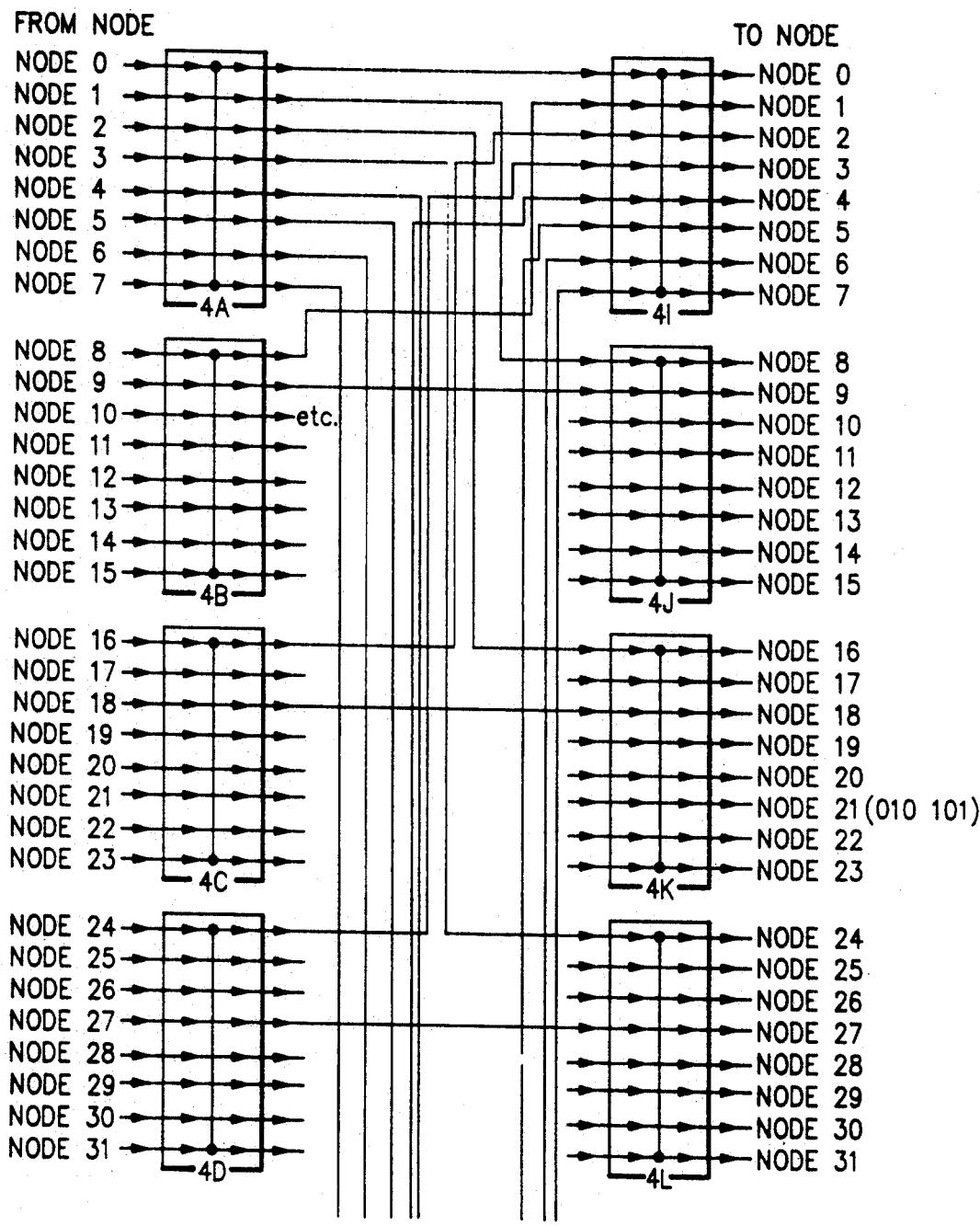
FIG. 11 illustrates a full multi-sender connection example and shows the connections established in each multi-sender/switching apparatus comprising a two-stage interconnection network for connecting all 64 nodes in multi-sender and broadcast fashion to all 64 nodes simultaneously.
Figure 11B:
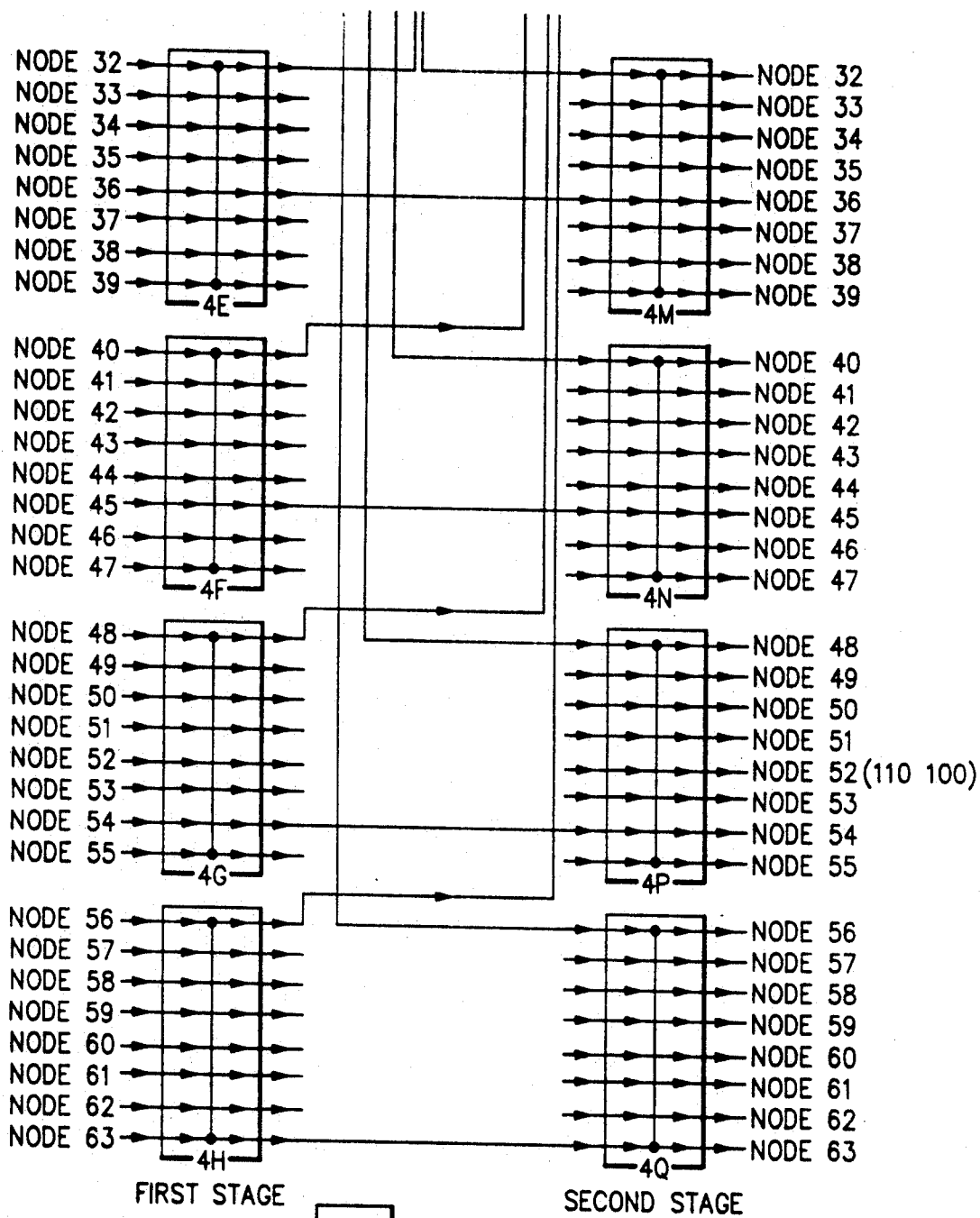

After node 1 has established its broadcast connection to all nodes, it transmits the multi-sender priority command (ones on all eight data lines) to all n nodes simultaneously during T3, and all nodes join the operation during T3. Joining the operation involves each node's individually forming OR connections in the network such that its inputs are joined or ORed together with those from all other nodes so that all nodes are participating as multiple senders in the GVT operation. After joining the operation, each node must individually signify that it has successfully joined the operation by raising its ACCEPT interface signal. At the beginning of T3, each node drives its individual ACCEPT line negative and then raises the ACCEPT line when it has joined the operation. Multi-sender/switching apparatus 4 which comprises network 20 logically ANDs the ACCEPT signals from all n nodes such that when all n nodes have successfully joined the multi-sender operation, the initiating node (node 1) and all n nodes see the joint ACCEPT line rise as a positive acknowledgement of all nodes' successfully joining the operation. Node 1 then steps the operation to T4 by pulsing the VALID interface line of FIG. 2 to a zero for one clock time 71, as shown in FIG. 7. All n nodes see this pulse to zero on VALID at about the same time and step in synchronization to T4, while at the same time driving their individual ACCEPT lines negative again and causing the network ANDed composite of the ACCEPT lines to go to zero—which is noted by all n nodes simultaneously. At this time network 20 has been configured to operate in the full multi-sender mode as shown by FIG. 11.

During T4, every node having a pending multi-sender operation pending, sends the priority value (command code) of its pending operation to network 20 in multi-sender fashion. Any node having a pending GVT command sends its priority value and command code (an 8-bit value of all ones) to the network at this time (T4). These 8-bit priority values are driven by each node onto the individual data lines (as shown in FIG. 2) that connect each node to network 20. If a node has no pending multi-sender operation, it drives an all zeroes value to the network 20. (All zeroes is not a legal priority value or command but instead is a no operation pending indication.) The apparatus 4 comprising network 20 logically ORs all of the individual 8-bit values and sends the result to every node so that all nodes seen on the data lines (shown in FIG. 2) coming from the network 20 a logical ORing of all pending priorities. The next action, which also occurs during T4, is to resolve priority amongst the various contenders and to decide on one (the highest priority) to be processed at this time. The priority is resolved by assigning the highest priority to the all ones value and descending priority until the lowest priority of all zeroes (no-op) is reached.

Standard combinational logic for resolving priority is used over the network to decide on the highest priority during any particular T4 time. The way this works is that every node which sent a non-zero priority to the network 20 examines the ORed value it receives back from the network 20. It compares the 8-bit priority value that it transmitted to the ORed value it receives back on a bit by bit basis, starting with the high order bit 0 (DATA 0). If the bits disagree, the node realizes that it is not the highest priority requestor, and it changes the value of the priority that it is transmitting to the network 20 to all zeroes and disables itself from contending any further during this particular T4. However, it will await a subsequent T4 and contend again later. If the two DATA 0 bits being compared agree, the node knows it is still in the competition and compares the next bits on the DATA 1 lines. This continues with the lower priority contenders dropping out of the competition until the combinational logic settles out leaving only the highest priority contender or contenders remaining and driving the same one priority value to the network 20. The winner (or winners) will see an identical comparison between the priority value that they are driving to the network 20 and the priority value that they are receiving back from the network 20. This is the winning priority value—the highest pending value presently available. As every node drops out of the competition or sees an identical compare, it activates its individual ACCEPT line to network 20 as an indication that it has completed its part in the priority calculation being made over network 20. When all nodes have completed the priority calculation and raised their ACCEPT signals, the multi-sender/switching apparatus 4 which comprises network 20 logically ANDs the ACCEPT signals from all n nodes such that the initiating node (node 1) and all n nodes see the composite ACCEPT line from network 20 rise as a positive acknowledgement that the priority calculation has completed successfully. Node 1 then steps the operation to T5 by pulsing the VALID interface line of FIG. 2 to a zero for one clock time 73, as shown in FIG. 7. All n nodes see this pulse on VALID at about the same time and step in synchronization to T5, while at the same time driving their individual ACCEPT lines negative and causing the network 20 ANDed composite ACCEPT line to go to zero—which is noted by all n nodes simultaneously. Additionally, at the end of time T4, each node notes the winning priority value and enables itself to participate as a multi-sender during T5 in the winning GVT or other multi-sender operation.

At the end of T4, one sender or several senders having the same priority have won the multi-sender honors and defined what operation will be performed during T5 to T8. In our timing example in FIG. 7, since the GVT OP signal is active, the all ones GVT command will win the competition at T4 because it is the highest priority operation and will dominate over other commands sent to network 20. The GVT is then declared to be the multi-sender operation to be performed at this time. Any number of nodes can simultaneously be presenting the GVT command to network 20, and they will all be declared winners of the competition by setting their WIN COMPETITION signals, as shown in FIG. 7. All the GVT winners can participate in and be satisfied with same GVT operation, as shown in FIG. 7.

Starting at T5, all n nodes begin their simultaneous calculation of GVT (minimum of all n local times as stored in the individual local time Registers 6 as shown in FIG. 1). Our example assumes that GVT is a 31-bit value that requires four sequential byte-wide sub-calculations (C=G/P=31/8=four) over the 8-bit network 20. T5 to T8 each provide a time frame for performing one sub-calculation involving one byte of GVT, starting with the high order byte of GVT at T5. During each sub-calculation the multi-sender network configuration shown in FIG. 11 is still maintained and the logical OR function of the network is used to make the GVT sub-calculations. With the logical OR configuration of network 20, a logical 1 on any input data line to the network dominates and causes the corresponding output data lines to go to logical ones. Thus, the network finds the maximum value for any given data line and all n inputs must be zeroes to get a 0 output from the network. GVT is just the opposite in that it wants to find the minimal value of all the local times. Therefore, the inverse (one's complement) of local time is sent to the network so that it can calculate the maximum of the inverse local times, which is the same as the minimum of the local times. Thus, at T5 every processor node sends the inverse of its high order byte of local time to the network. At T5 every node examines the ORed value it receives back from the network. The node compares the inverse local time it transmitted to the ORed value it receives back on a bit by bit basis starting with the high order bit on the DATA 0 line. If the bits disagree, the node realizes that it does not have the lowest local time, and it removes its value from network 20 and replaces it with all zeroes for the remainder of the GVT calculation through time T8. If the 2 bits agree, the node knows it is still in the competition and compares the next bits on the DATA 1 lines. This continues for the 8-bits sent to network 20. As each node completes its T5 task of deciding whether it's local time Register 6 high-order byte is or is not equal to the ORed composite value received back from network 20, it sets its individual ACCEPT signal to network 20. At the beginning of T5, each node drives its individual ACCEPT line negative and then raises the ACCEPT line when it has completed its GVT sub-calculation in regards to byte 0. Multi-sender/switching apparatus 4 which comprises network 20 logically AND's the ACCEPT signals from all n nodes such that when all n nodes have successfully completed the byte 0 sub-calculation, the initiating node (node 1) and all n nodes see the joint ACCEPT line rise as a positive acknowledgement of all nodes' successfully completed byte 0. Node 1 then steps the operation to T6 by pulsing the VALID interface line to a zero at time 75, as shown in FIG. 7. The VALID line is broadcast through network 20 so that all n nodes see this pulse to zero on VALID at about the same time and step in synchronization to T6. Each node then drives its own individual ACCEPT line negative again, thus causing the network ANDed composite of the ACCEPT lines to go to zero—which is noted by all n nodes simultaneously.

At the end of T5, the value left on the network is the highest order byte of the inverse GVT. All nodes read this value from the network and store the inverse of this byte into the high byte of their individual GVT Registers 9 of FIG. 1. At this time, one or many nodes can have byte 0 in their individual local time Register 6 equal to the new byte 0 just stored into their individual GVT Register 9—all of these nodes proceed to the next GVT sub-calculation at T6. However, all the nodes that already know that their value of local time is not the lowest local time (GVT), remove themselves from active participation in the T6 to T8 sub-calculations by sending all zeroes to network 20 on their individual data lines to the network.

The same type of minimization sub-calculations occur sequentially for each byte of GVT information at times T6 to T8 until the entire new 31-bit GVT value is stored at each node at the end of T8. Since there are only 31-bits of GVT to be calculated over network 20, this leaves one spare bit in the four byte network operation. This bit, located on DATA line 7 during T8, is used as a multi-sender status bit. All nodes drive their multi-send status to network 20 over DATA line 7 during time T8. The network treats this bit as if were any other GVT data bit and ORs all the multi-sender status bits together to generate the composite ORed result to all n nodes from network 20. If any node has a multi-sender operation pending which has not been satisfied by the present operation, it drives this bit as a logical 1 to network 20 to indicate that it has a multi-sender operation pending. Nodes that do not have any multi-sender operations pending drive this bit as a logical 0 to network 20. If at the end of time T8 the composite multi-sender status bit from network 20 (DATA line 7) is a 0, it indicates that there are no pending requests for multi-sender operations, and the initiating node terminates the GVT operation. All network 20 broadcast and multi-sender connections are broken by dropping the BRDCAST and VALID lines to network 20 at time 81 (after the composite ACCEPT signal from network 20 has returned to a logical 1).

If at the end of time T8 the composite multi-sender status bit from network 20 (DATA line 7) is a 1, it indicates that there are further pending requests for multi-sender operations. The initiating node maintains all network 20 connections and continues processing multi-sender operations by leaving the BRDCAST line set and pulsing the VALID line at time 83, as shown in FIG. 7B. This action causes all nodes to return to time T4 from time T8 and to perform another priority calculation to determine which pending multi-sender is now highest priority and should be executed next. Multi-sender operations will continue to be executed one after the other until DATA line 7 goes to a zero at the end of time T8 to terminate the sequence and break all network 20 connections, thus returning the network to the IDLE state and leaving it ready to perform further commanded connections of any type supported. Note that the original initiating node stays in control of the execution of all subsequent pending multi-sender operations even though it is not really initiating the operation since this is easier to implement as opposed to switching control of the subsequent operations.

There are several exception conditions that can occur and cause the GVT operation to be terminated early. If any time from T3 to T8 does not get an ACCEPT response from all nodes, the initiating node 1 will time-out after a predetermined time interval and terminate the operation by resetting all of its network 20 interface signals. Also, any receiving node can terminate the GVT operation by issuing the REJECT interface signal of FIG. 2 if it detects an error or an exception condition. The REJECT conditions are logically ORed in the multi-sender/switching apparatus 4 of network 20 so that any one REJECT signal from any node will cause the operation to terminate. The initiating node can retry any terminated or REJECTed GVT operation at any time.

Figure 9:
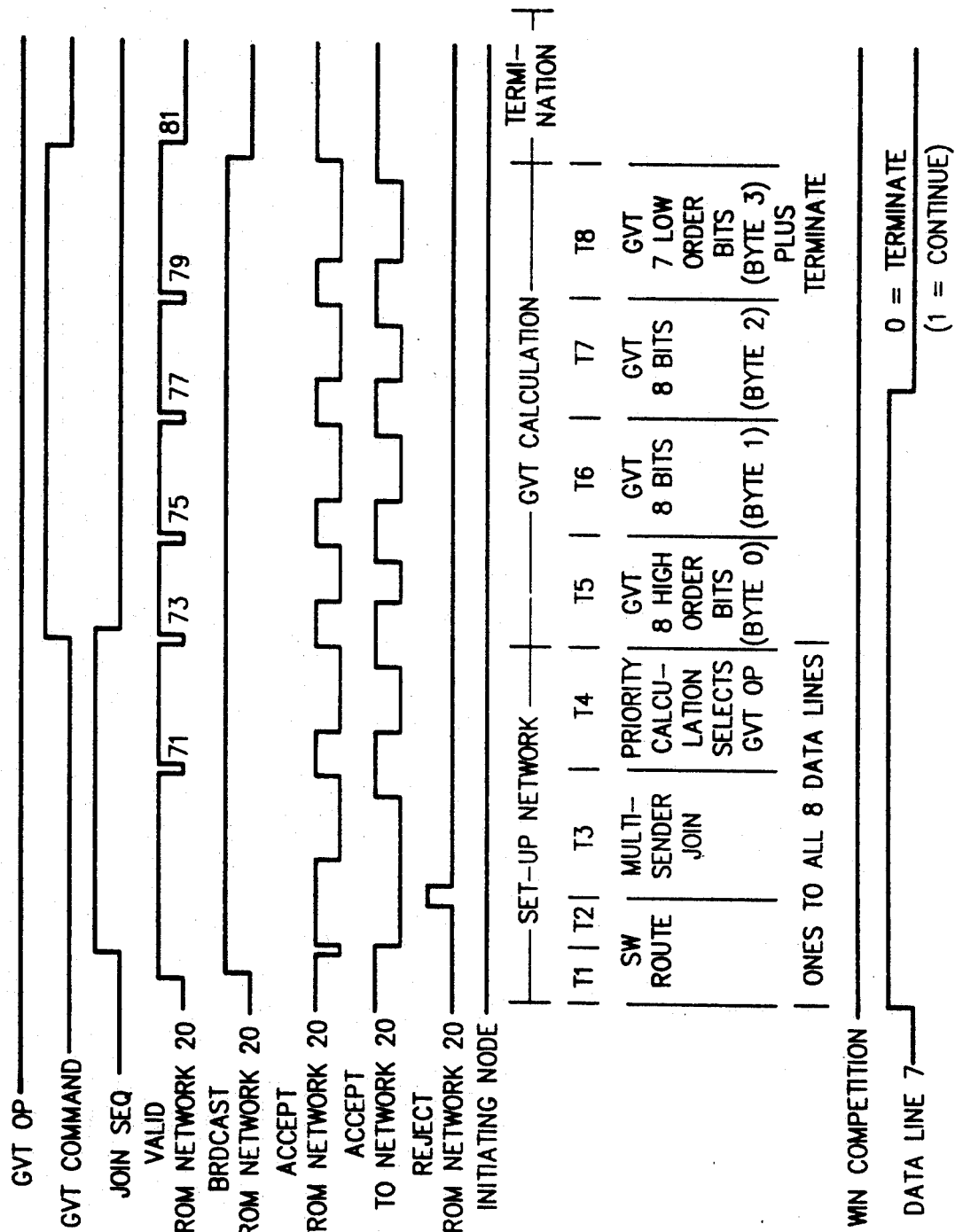
FIG. 9 illustrates a typical example of the GVT-NET timing and the sequential steps involved in executing a GVT calculation over the multi-stage network as related to the nodes which join in and participate in the GVT multi-sender operation.

Refer to FIG. 9 for a further example of the over-all timing of the GVT operation as it is executed over the network 20 and responded to by a typical joining node (all other nodes except node 1 in the example of FIG. 7). The GVT OP signal is not set in a joining node and remains at a 0 to indicate that the node has no pending GVT operations to perform over the network 20. The joining node will not have any GVT operations to initiate at this time, but it will join and become involved in the GVT calculations started by other nodes because it might presently have the lowest local time value. The first indication that a joining node receives that another node is starting a GVT operation is that the incoming VALID and BRDCAST lines from network 20 go active as shown in FIG. 9. This means that the initiating node has progressed to T3, established its broadcast connection through both stages of the network 20, and sent the JOIN command (all ones) to the network 20. The joining node decodes the 8 data lines it is receiving from the network 20 as being all ONES and sets the JOIN SEQ signal. The JOIN SEQ signal starts the joining node stepping through its own eight sequential timing steps (T1 to T8) coming from its individual operation control counter; these are the exact same steps it would have progressed through if it had been the initiating node. The JOIN SEQ signal also immediately causes the joining node to deactivate its ACCEPT signal to network 20 to indicate that it has not yet joined the multi-sender operation.

It is necessary for a joining node to establish some connections in the network 20. Referring to FIG. 8, it can be seen that the initiating node 1 did not establish full multi-sender connections in the network as shown in FIG. 11. Actually node 1 made broadcast connections in 9 of the 16 multi-sender/switching apparatus 4 devices. Therefore, a joining node (node 15 for instance) has to establish some of its own multi-sender connections. In the first stage of the network 20 coming from node 15 (block 4B in FIG. 8) no connections have been made at all so node 15 must establish a broadcast connection in the first stage multi-sender/switching apparatus 4B connecting node 15 to all eight outputs, similar to the node 1 connections to all eight outputs in the first stage multi-sender/switching apparatus 4A. Node 15 is shown to make the desired connections in FIG. 10 block 4B. In the eight second stage multi-sender/switching apparatus 41 to 4Q devices, the connection from node 15 comes in on the second input port from the top left at all eight devices as shown in FIG. 8. There has been no previous connection established here either by node 1 in FIG. 8 so node 15 has to make 1 connection in each of the eight second stage devices 41 to 4Q, as shown in FIG. 10, to join the broadcast connections already set-up in the second network 20 stage by the initiating node.

Figure 10A:
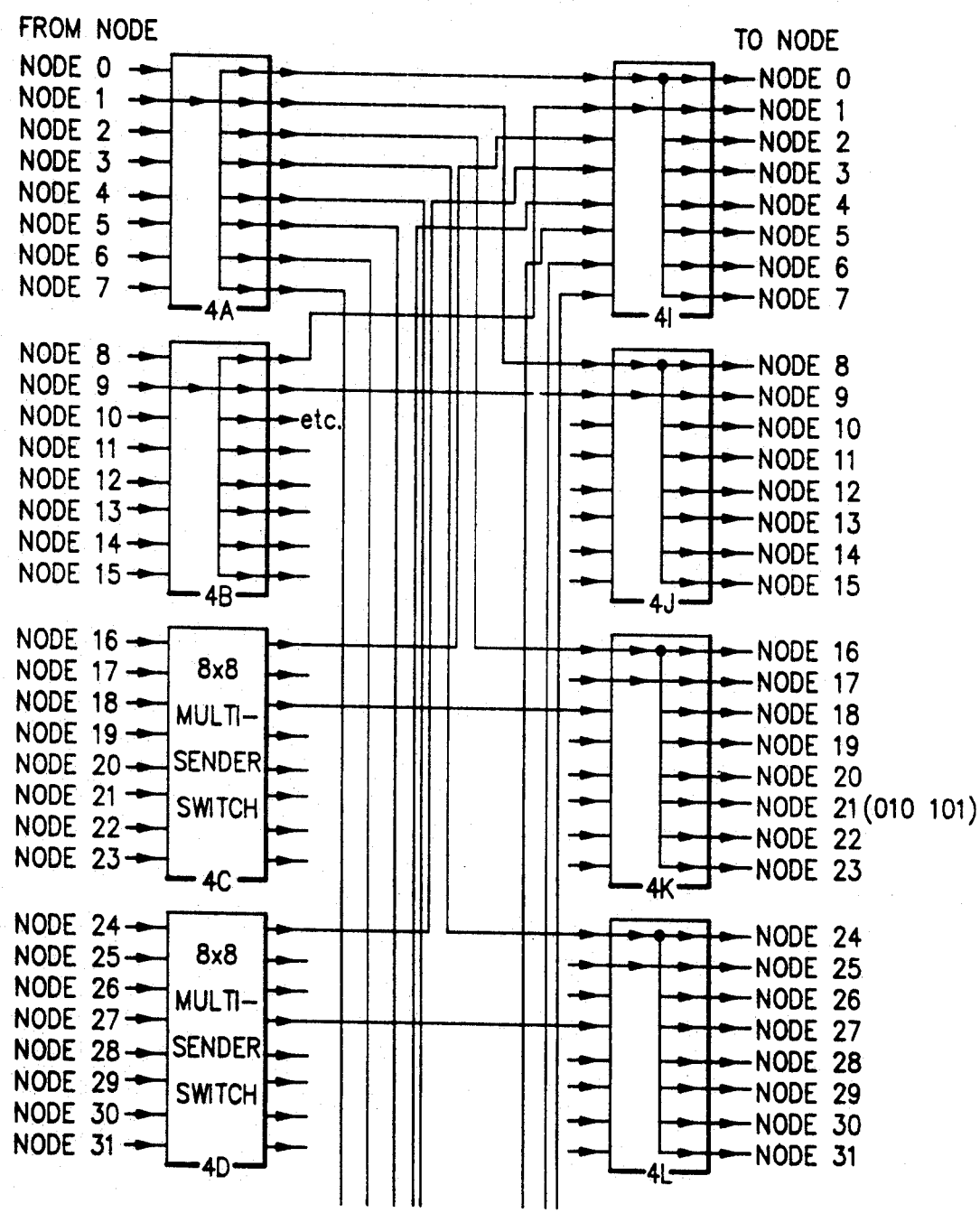
FIG. 10 illustrates a typical multi-sender JOIN example and the connections established in each multi-sender/switching apparatus comprising a two-stage inter-connection network for connecting nodes 1 and 15 in broadcast fashion to all 64 nodes simultaneously.
Figures 10, 10B:
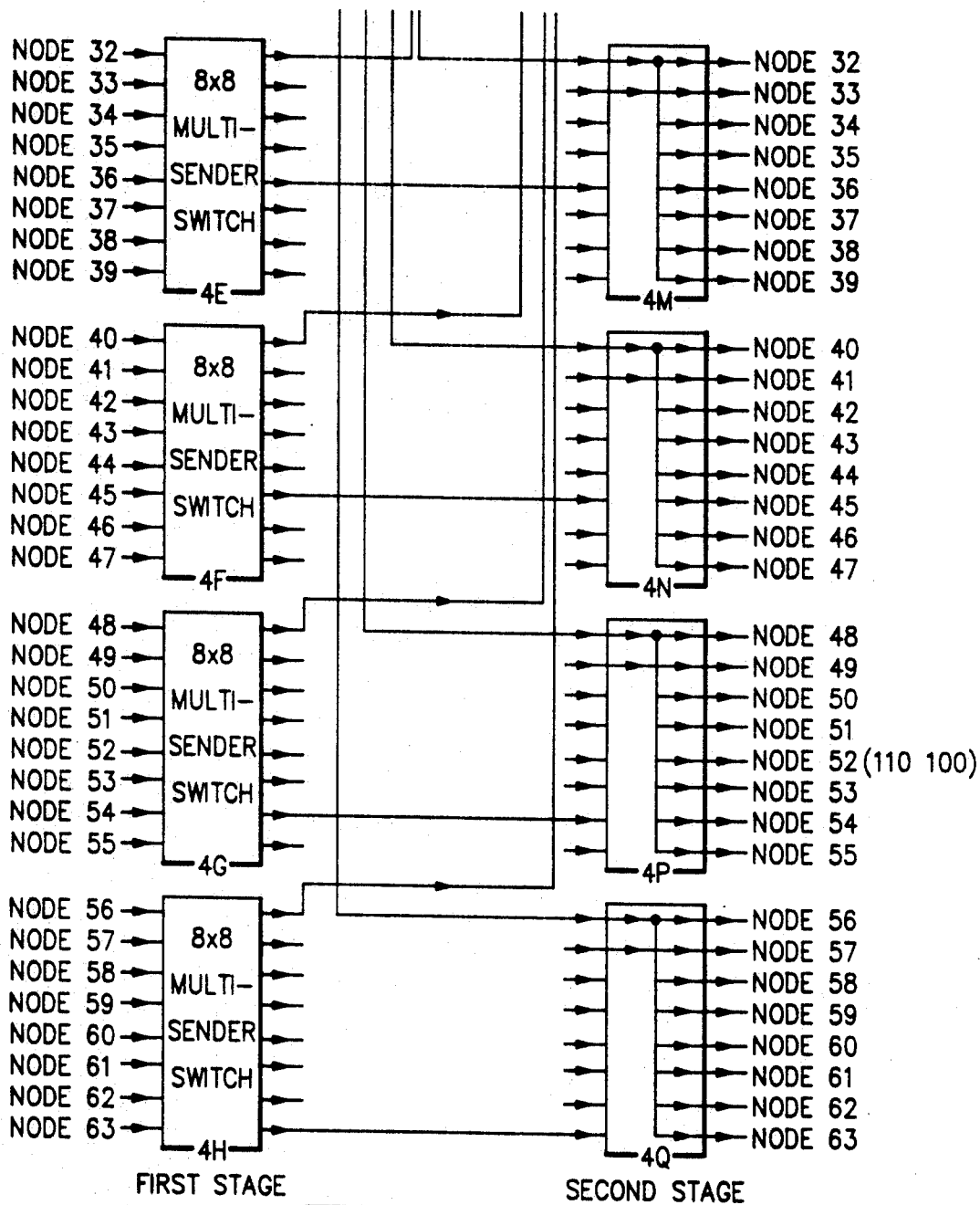

During T1 and T2, the joining node 15 establishes broadcast connections to all n nodes through network 20 as shown in FIG. 10, making the stage 1 connections during T1 and the stage 2 connections during T2. The joining node will not be successful at establishing a full broadcast connection because there is only one such connection allowed in the network 20 at any given time, and this has already been established by the initiating node. However, the joining node attempting the broadcast will cause it to be connected in to the present broadcast as a multi-sender joining the operation, if the joining node responds with a special sequence when its broadcast attempt gets rejected. The details of the JOIN sequence and how it is implemented at the multi-sender/switching apparatus 4 is described in detail in the concurrently filed and referenced application having IBM Docket EN9-91-030B. The example in FIG. 9, shows typically how the joining node gets a REJECT back from its broadcast attempt either during T1 or T2. In the example of node 15, no previous broadcast is established in the first stage of network 20 (block 4B of FIG. 8), so node 15's broadcast attempt during T1 gets ACCEPTed as shown in FIG. 9 and a broadcast connection is then established in the first stage from node 15 to all 8 outputs as shown by block 4B in FIG. 10. However, all network 20 second stage devices 41 to 4Q already have broadcast operations established in FIG. 8 and, thus, node 15's broadcast attempt at T2 is REJECTed as shown in FIG. 9. Subsequently, if node 14 tried to establish a broadcast connection to block 4B in FIG. 10, it would be rejected at T1 because node 15 already has a broadcast pending in the first stage device 4B. Thus, the joining node's attempt can either be REJECTed during T1 or T2. In either case the joining node, after being rejected drops off its transmitting interface to network 20 temporarily except that it leaves the BRDCAST active (as shown in FIG. 9) to indicate that it wishes to JOIN the broadcast in progress. The multi-sender/switching apparatus 4 devices recognize this command from the joining node and immediately connect it into the broadcast in progress at all stages. Special sequencing logic causes the control counter in the joining node to step from a REJECT given at either T1 or T2 to force state T3. This causes the joining node to catch up to the initiating node which is already at T3 and waiting for the other nodes to JOIN. The joining node, when it arrives at T3, immediately raises its ACCEPT signal to network 20 to indicate that it has successfully joined the broadcast at T3.

When all 63 joining nodes have joined the operation in progress, the full multi-sender interconnection is established through network 20 as shown in FIG. 11. The vertical line down the center of each device 4 in FIG. 11 is a symbol indicating that all eight input ports of the device have been logically ORed and sent to all eight output ports of the device. The network 20 has made the connections shown in FIG. 11 at the end of T3, when all the individual ACCEPT signals have been activated and lead to pulse 71 of FIGS. 7 and 9 on the VALID signal. From this point, on the connections shown in FIG. 11 are maintained until the present operation is terminated.

Also from this point, the joining node acts very similar to the initiating node and steps in sequence with the initiating node based on pulses 71, 73, and 75 that it receives from the initiating node. The only different response is that the joining node senses that all ones are on the data lines from network 20 at time T4 and it decodes this to be a GVT Command and sets the GVT Command signal at the end of time T4. FIG. 9 shows that the joining node merely supports the multi-sender operations being performed over the network 20; it never sets its INITIATING NODE or WIN COMPETITION signals because the joining node shown here is assumed to have no pending GVT or multi-sender operations.

Figure 12A:
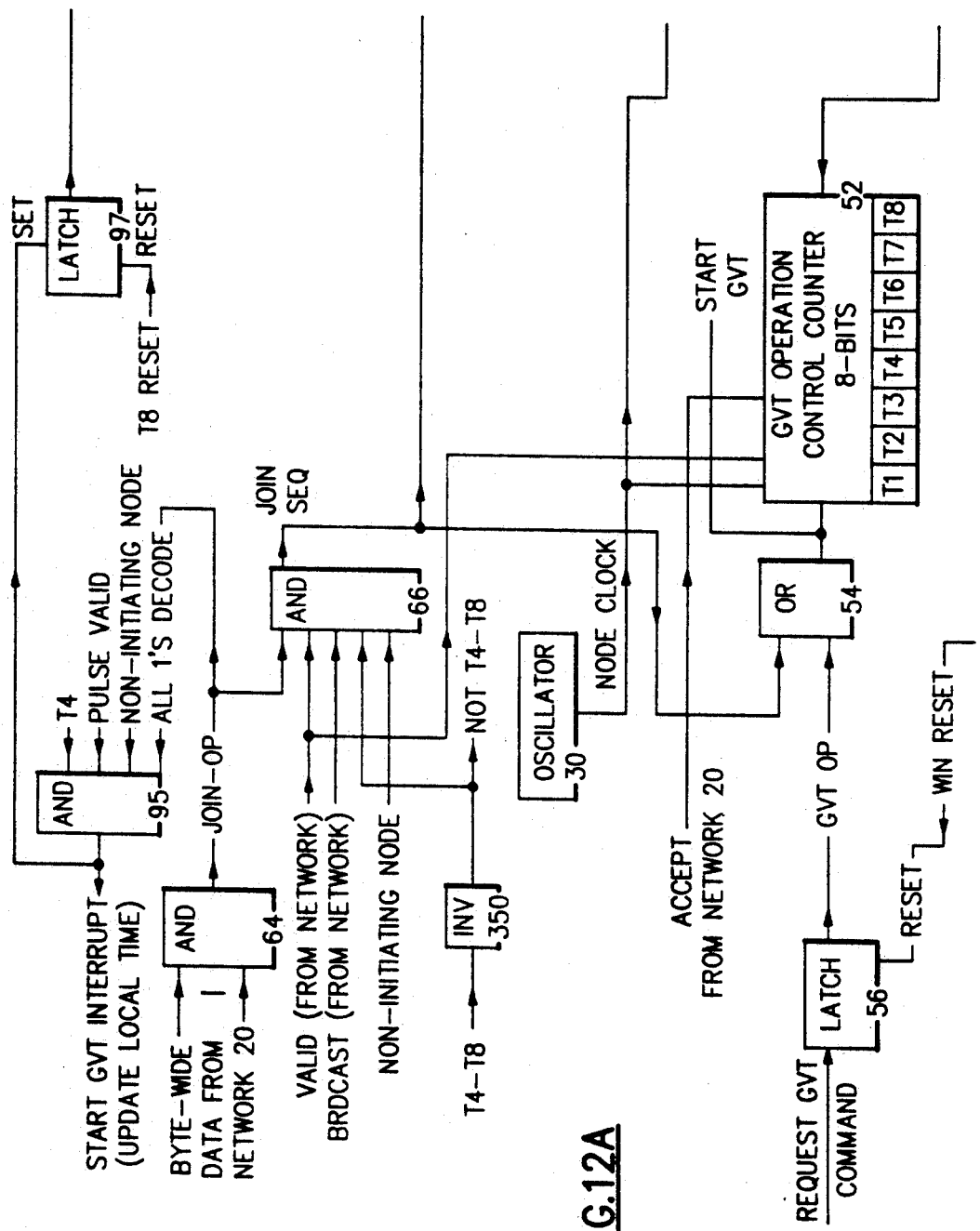
FIG. 12 illustrates in part the detailed logic implementation of the preferred embodiment of the GVT-NET function located at each processing node, and in particular the initiating, joining, and timing functions required.
Figure 12B:
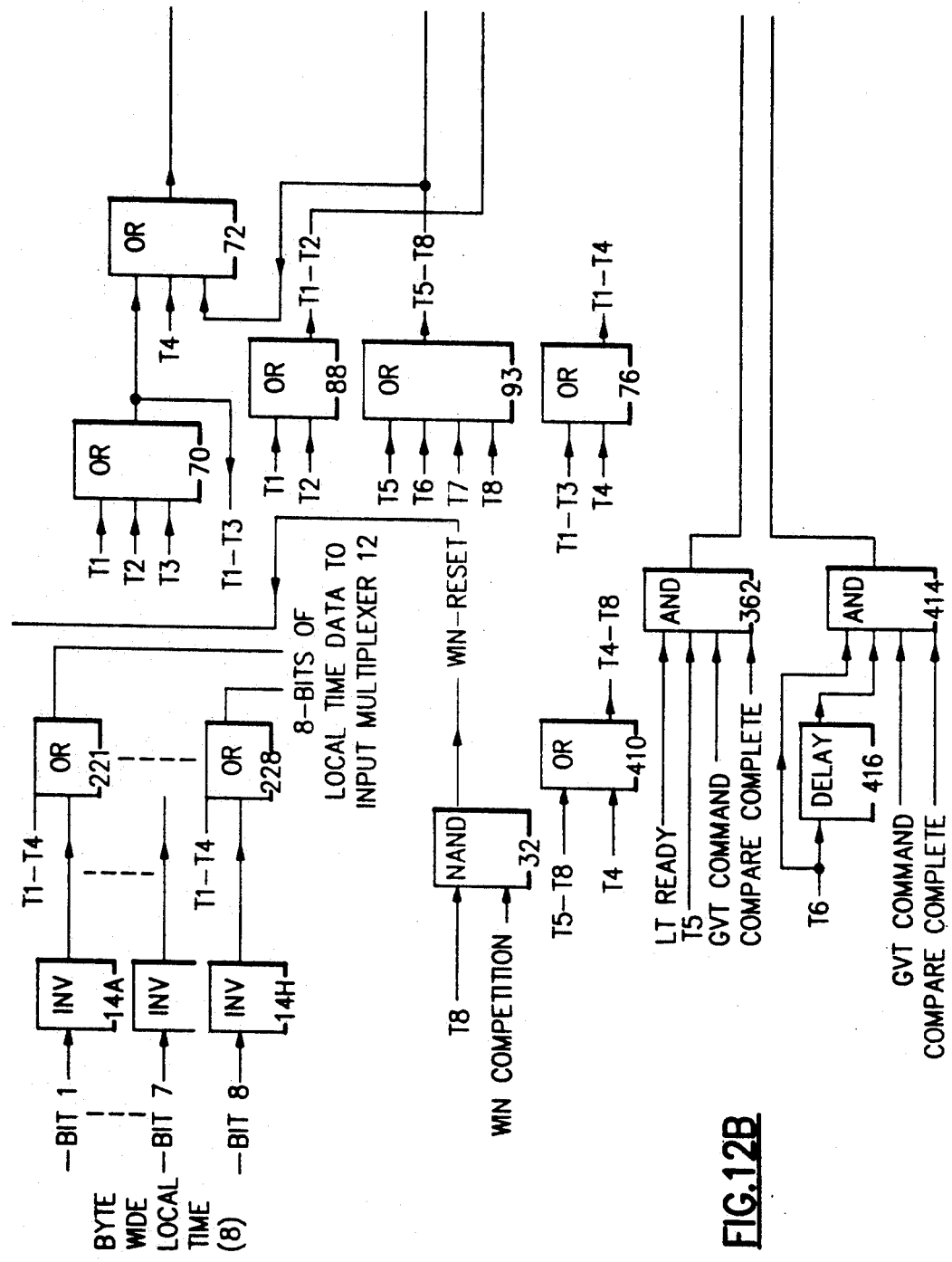
Figure 12C:
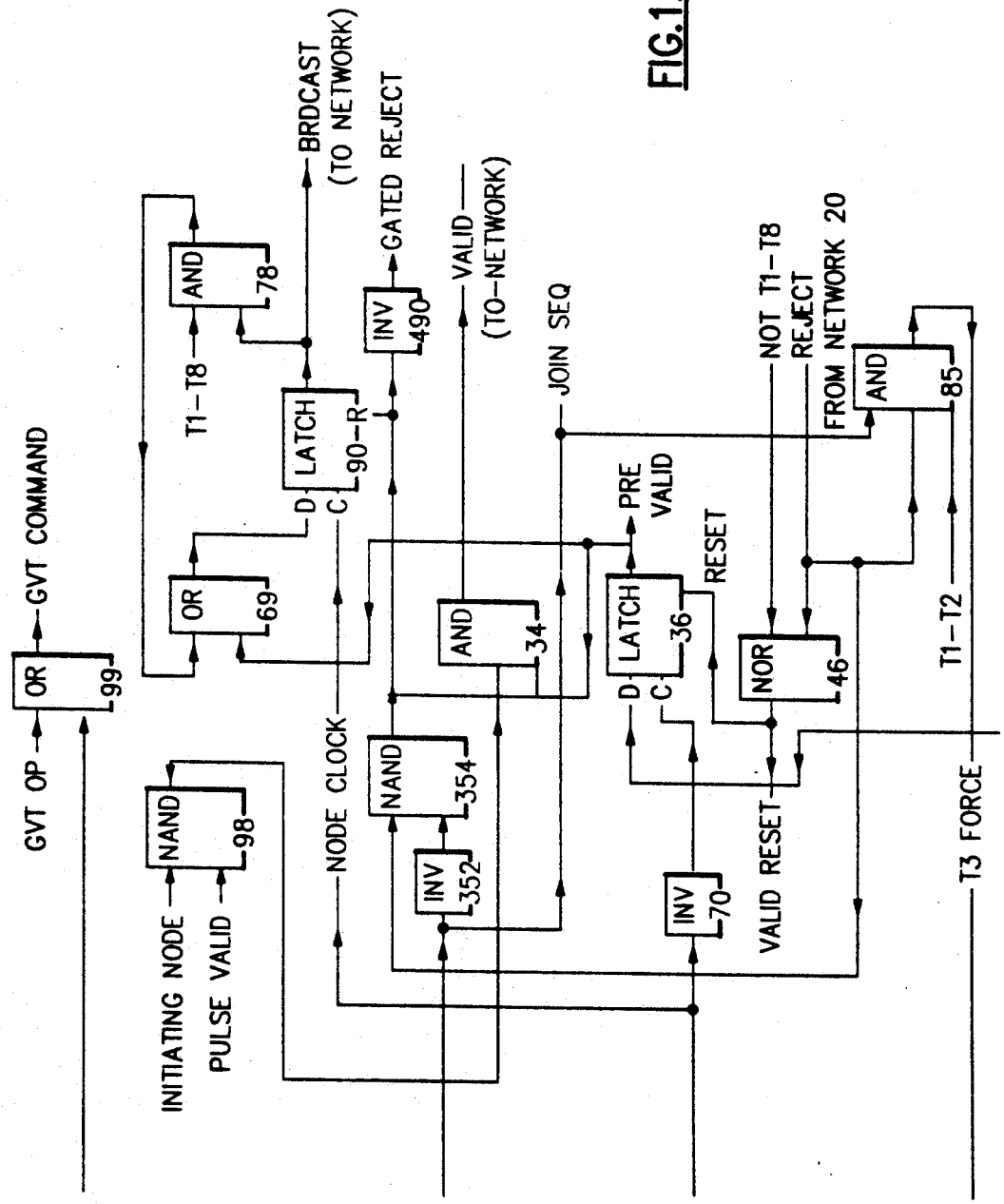
Figure 13A:
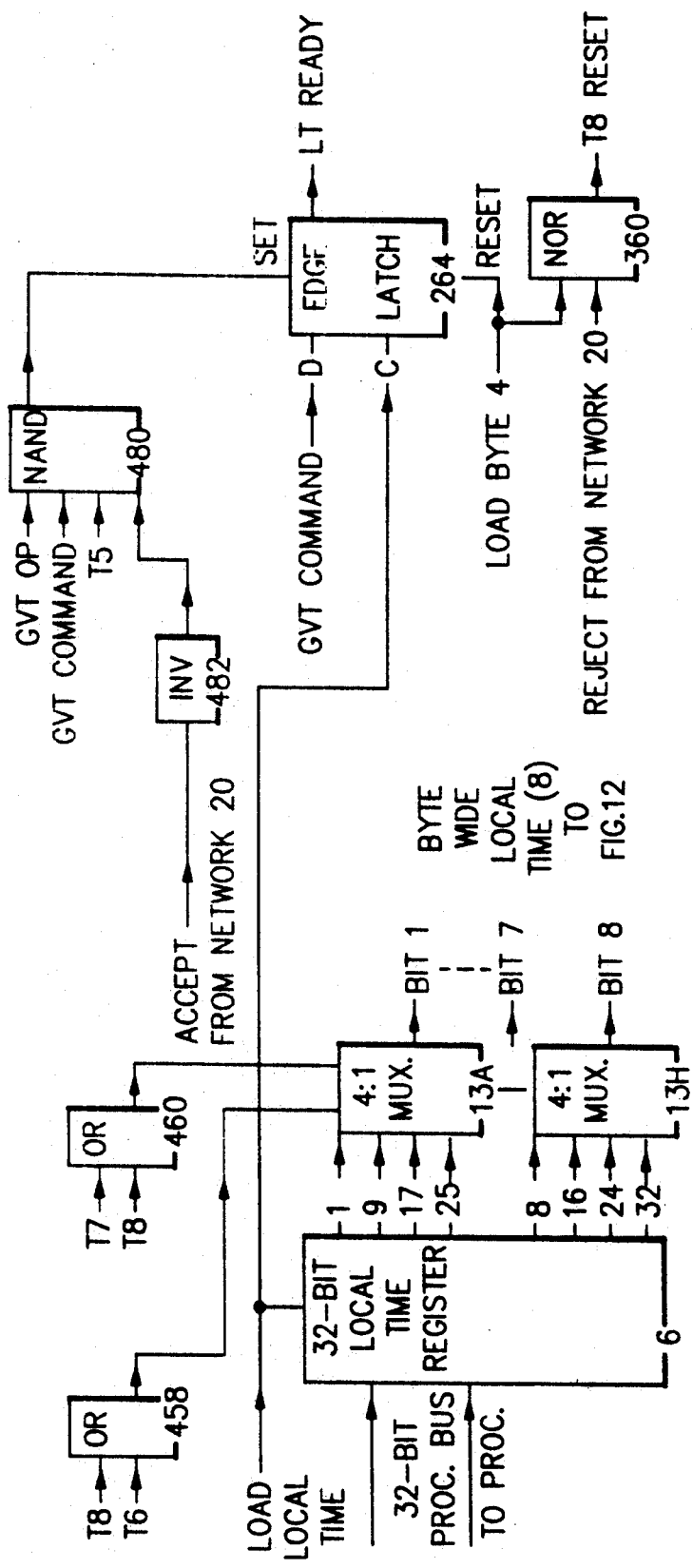
FIG. 13 illustrates in part the detailed logic implementation of the preferred embodiment of the GVT-NET function located at each processing node, and in particular the priority resolution, local time sending, and GVT receiving functions required.
Figure 13B:
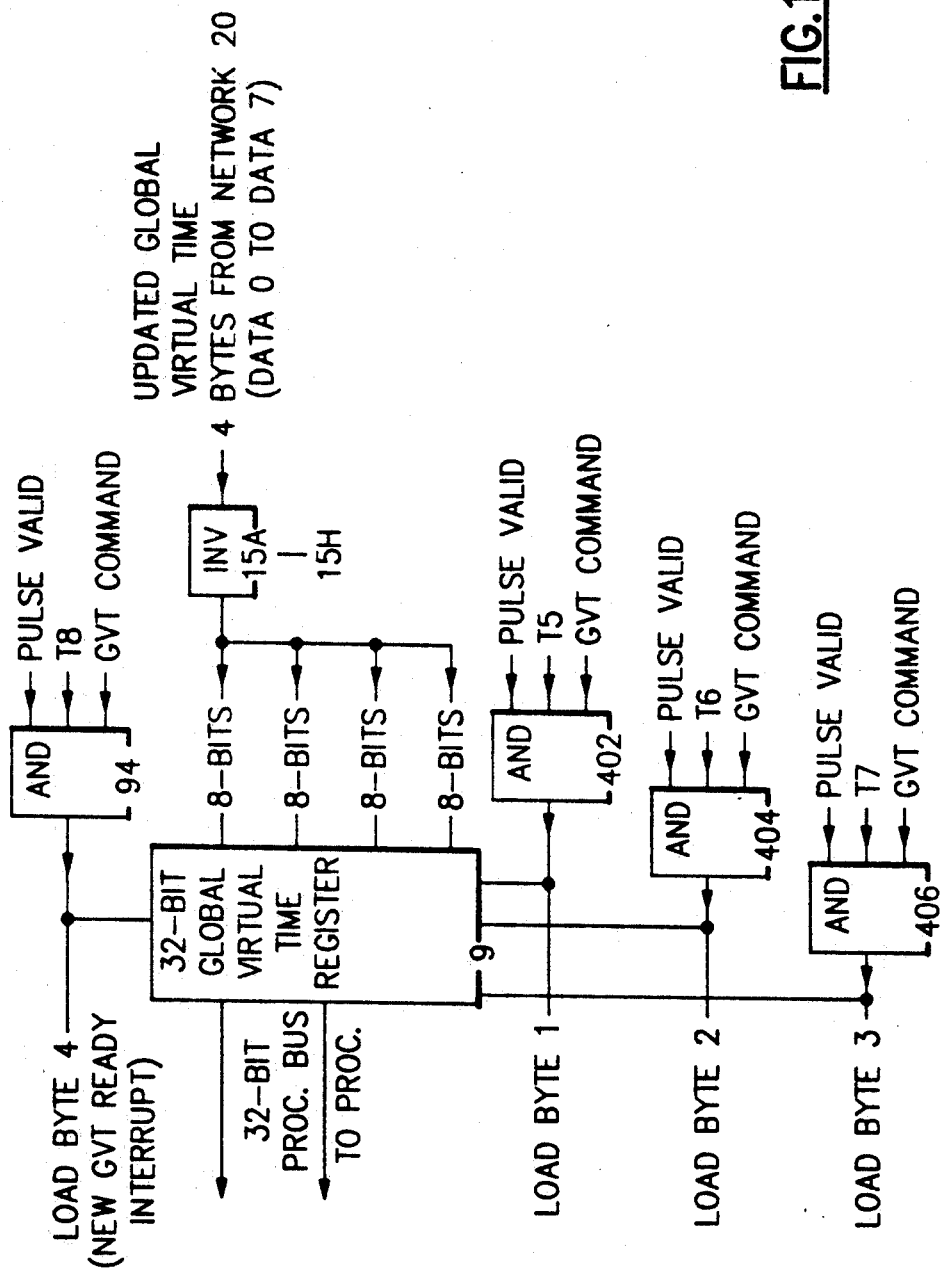
Figure 13E:
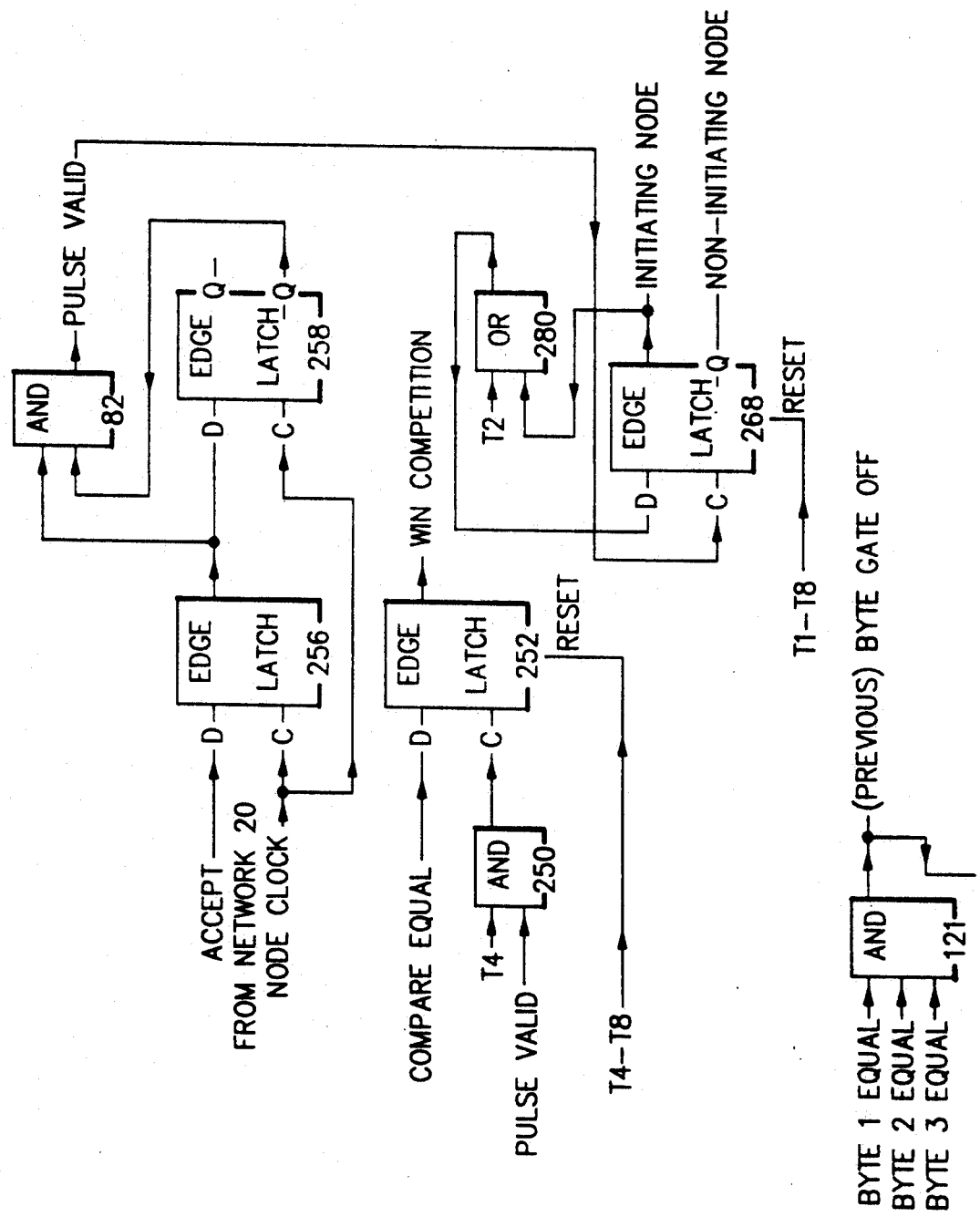

Referring to FIG. 12 and 13, the detailed logic to implement the GVT-NET operation at each node is shown. Each node must have the capability of being an initiating node at times and a joining node at other times; therefore, the logic shown in FIG. 12 and 13 is a common set of logic which is capable of performing either initiating node or joining node sequences on a mutually exclusive basis.

The GVT-NET operation begins with the node processor 1 sending its latest 31-bit local time data to register 6 in FIG. 13, which defines the time the local node processor 1 has advanced to in regard to its local parallel processing tasks. Next, node processor 1 sends a REQUEST GVT COMMAND signal to latch 56 in FIG. 12 which causes the latch to set and denote that a GVT OP is pending. Latch 56 immediately begins the GVT operation through OR gate 54 (START GVT) which sets T1 in Operation Control Counter 52. T1 leads to the setting of the BRDCAST and VALID signals to network 20 and sends all ONES on the eight data lines to the network to command the broadcast connection. This is accomplished by the T1 signal's propagating through OR gates 88 and 99 to set latch 36 which sets in synchronization with the fall of the local NODE CLOCK from Oscillator 30. Latch's 36 being set raises the VALID line to network 20 through AND gate 34 and causes latch 90 (BRDCAST) to set at the rise of the next NODE CLOCK. This causes the BRDCAST signal to rise to the network 20 one half clock time after latch 36 sets by enabling latch 90 to set through OR gate 69 and propagating the latch 90 output to the network 20. OR gates 221 to 228 cause an all ones value to be sent to multiplexer 12 (FIG. 1) during times T1, T2, T3, and T4 for the purpose of commanding a broadcast during times T1 and T2 to the two stage network 20, for commanding a multi-sender join operation during time T3 and for defining the high priority GVT operation during time T4. The outputs of gates 221 to 228 are subsequently forwarded to the network through gates 131 to 138 in FIG. 13 after being passed through multiplexer 12.

Timing signals T1 and T2 feed into latch 36 through OR gate 88 and along with the INITIATING NODE signal in gate 99 to keep VALID active from the initiating node for the duration of the operation. Gate 99 holds latch 36 reset if the node is not the initiator (a joining node) of the GVT operation, except for times T1 and T2 when the joining node attempts a broadcast and joins the operation in progress. If REJECT is returned from network 20, it terminates VALID through NOR gate 46 and causes a force to time T3 through AND gate 85 if a JOIN sequence is active. Any subsequent REJECT after T3 also terminates the operation by resetting VALID and BRDCAST to the network 20. However, the normal reset of latch 36 occurs when all of the timing signals T1 to T8 have returned to the inactive state (0) at the end of the GVT operation as denoted by the NOT T1-T8 signal into gate 46 going to a 1 and propagating through NOR gate 46 to cause latch 36 to reset.

The operation control counter 52 advances from T1 to T2 to T3 every time it receives a rising edge on the composite ACCEPT interface line coming from network 20. The rising edge of the incoming ACCEPT signal also causes the VALID signal 34 to the network 20 to pulse for times T3 to T8. This is accomplished by latches 256 and 258 (FIG. 13) which sample the ACCEPT from network 20 based on a high frequency NODE CLOCK generated by oscillator 30 (FIG. 12). Gate 82 generates a pulse that is one clock time wide based on the condition that ACCEPT has just arrived from network 20 and has set latch 256 but has not yet set latch 258. One clock time later latch 258 will set, causing gate 82 to deactivate. Therefore, the PULSE VALID signal 82 is active for one clock time only. The pulse generated by gate 82 is used to pulse the VALID signal from the initiating node to network 20 through AND gate 34.

BRDCAST is generated to network 20 one half clock later than VALID through Latch 90. Once set latch 90 remains active for the duration of the GVT operation unless it is reset by REJECT from network 20 through NAND gate 354. The normal reset of latch 90 occurs when all the timing signals T1 to T8 have returned to the inactive state (0) at the end of the GVT operation as denoted by the T1-T8 signal into gate 78 going to a 0 and propagating through OR gate 69 after the VALID signal goes to 0 to cause latch 90 to reset on the next rise of the NODE CLOCK signal. For JOIN operations, BRDCAST is also generated to network 20 through latch 90 and once set at T1 it is held active by the feedback loop through OR gate 69 until it is reset by the VALID and T1-T8 signals both going to zeroes to break the feedback loop. Latch 90 is prevented from being reset by the REJECT received by the broadcast attempt during a JOIN sequence through inverter 352 and NAND gate 354, which inhibits the reset at this time. The time T4 to T8 input to AND gate 66 (JOIN SEQ) through inverter 350 causes the JOIN SEQ signal to go inactive and the inverter 352 to go active after T4 so that any subsequent reset will be enabled to pass through NAND gate 354 and cause the GVT operation to terminate.

Gate 72 and the SELECT NORMAL TRAFFIC signals provide the proper controls to input multiplexer 12 (FIG. 1) to cause it to select normal data when it is not in GVT mode, network routing data, multi-sender join controls, and GVT operation definition data of all ONES from gates 221 to 228 during times T1 to T4, and local time data from register 6 during times T5 to T8 (also provided through gates 221 to 228, as well as multiplexers 13 and inverters 14).

The network 20 selects only one command to process at any given moment by performing a priority competition during T4. The purpose of gates 131 to 138 of FIG. 13 is to calculate the highest priority pending amongst all nodes at T4. This is done by comparing the bit pattern of the priority value sent to network 20 to the value received back from the network. This comparison is done in x-or gates 100 to 107. If the high order bit 0 does not compare as detected by x-or 100, NAND gate 121 output goes to 0 and forces all data lines driven to network 20 to zeroes; in other words, it removes itself from the competition. Likewise, if the next high order bit 1 does not compare as detected by x-or 101, NAND gate 122 (not shown) output goes to 0 and forces data lines 1 to 7 driven to the network to zeroes; in other words, it removes itself from the competition. Note that is not necessary to remove any high order data bit which compares favorably from driving the network, because it is not causing any error in the calculation. Therefore, similar logic is used to remove the discomparing bit and all lower order bits from the calculation. Note that if all 7 high order bits compare and bit 7 does not, that gate 128 will only force DATA LINE 7 to a zero through gate 138.

The COMPARE EQUAL signal 110 determines whether the priority selected by the network 20 is the same as that sent to the network. If the signal is a active, the node has won the priority competition and can proceed with the GVT operation. In our example, since GVT has been assumed to be high priority, it will win the priority competition and will always proceed with the rest of the GVT operation (T5-T8) immediately. Note that if the GVT operation was to be assigned a lower priority number, it might not always win the competition and would only proceed when it did win the competition. The COMPARE EQUAL signal is generated by gate 110 as the OR of a comparison of the priority value being sent to the network with the priority value being returned from the network. The compare is made by exclusive-or (x-or) gates 100 to 107. If any x-or inputs do not compare, the x-or gate will generate a logical 1, which forces OR gate 110 to a zero and indicates not equal.

Referring to FIG. 13, the WIN COMPETITION latch 252 is generated by clocking latch 252 from AND gate 250 which creates a pulse at PULSE VALID time at the end of time T4. Thus, latch 252 samples the state of the COMPARE EQUAL signal 110 and sets latch 252 if COMPARE EQUAL is a ONE. The WIN COMPETITION signal 252 causes the GVT operation to proceed immediately, and when the GVT operation is over, it causes the GVT OP latch 56 to be reset through NAND gate 32 at T8 (FIG. 12). The WIN COMPETITION signal 252 gets reset at the end of T8 when the T4-T8 signal goes to 0.

Referring to FIG. 13, latch 268 is used to differentiate an INITIATING NODE from a joining node (NON-INITIATING NODE). This decision is based on OR gate 280 which detects if an ACCEPT pulse has been issued from network 20 at T2 as detected by latches 256 and 258 and gate 82. When this occurs, the INITIATING NODE latch 268 is set and held set by the feedback loop through OR gate 280 until the operation is terminated by the T1-T8 signal when all timing signals go inactive at the end of a multi-sender operation or series of operations. The INITIATING NODE 268 signal is used in NAND gate 98 (FIG. 12) to cause the VALID signal generated by the initiating node to pulse through AND gate 34 every time that PULSE VALID 82 is generated. Note that if multiple multi-sender operations are executed in a back-to-back fashion by causing the operation counter 52 to branch from time T8 back to time T4 and to perform another operation rather than terminating, the T1-T8 signal 72 remains active and prevents the reset of INITIATING NODE latch 268 between multiple operations. This means that the same initiating node will remain in control of all subsequent multiple operations even through it is not requesting the successive operations.

Referring to FIG. 12, AND gate 64 monitors the data lines coming from network 20 to detect an all ONES data pattern during times T3 and T4. AND gate 66 detects a JOIN SEQuence has been commanded during time T3 by the initiating node if the output from AND gate 64 is active along with the VALID and BRDCAST lines from network 20, local time T4 to T8 signals are not set, and the NON-INITIATING NODE signal is set. Gate 66, when active, starts a JOIN SEQ as a joining node function through OR gate 54, which in turn starts the operation control counter 52 sequencing from T1. The signal generated by AND gate 64 is also used in AND gate 95 at time T4.

Every processor node 1 attached to network 20 must take an active part in every GVT operation whether or not it is the node requesting the GVT operation (the initiating node). The processor node 1 gets involved in the response to every GVT operation as shown in FIG. 12. AND gate 95 is a pulse that generates the START GVT INTERRUPT to the processor node 1 at all the non-initiating (joining) nodes, when the all ones GVT Command is decoded at time T4 as having won the priority competition. This informs the processor node 1 at the joining nodes that a GVT operation is presently in progress over network 20. The processor node 1 responds to the START GVT INTERRUPT by loading local time Register 6 with the present local time value for that particular node. The GVT-NET logic immediately gates the high order byte from its local time Register 6 to the data lines to network 20 through 4:1 multiplexers 13, inverters 14, OR gates 221 to 228, multiplexer 12, and AND gates 131 to 138. At the same time that processor node 1 loads register 6, the load pulse is detected by the LT READY latch 264 which sets immediately as an indication that the local time has been loaded and is ready to transmit data from register 6 to network 20 to begin the GVT calculation. The LT READY signal 264 is set differently at the initiating node because the processor node 1 does not receive the START GVT INTERRUPT and has previously loaded its local time Register 6. The initiating node sets the LT READY signal 264 during time T5 through NAND gate 480 which is enabled only for the initiating node based on the GVT OP signal being a 1. The presence of the ACCEPT signal from network 20 through inverter 482 guarantees that the ACCEPT signal has gone to a 0 over network 20 before it is driven back to a 1, insuring that a pulse will occur on the ACCEPT signal. The LT READY signal 264 then issues the ACCEPT signal to network 20 through AND gate 362 (FIG. 12), OR gate 412, OR gate 262 (FIG. 13), and AND gate 270 for both initiating and joining nodes to indicate that the present node has finished its T5 response and placed the high order byte of its local time Register 6 on the data lines to network 20. The LT READY signal 264 is reset at the end of T8 by the Load Byte 4 signal; however, it is only used at time T5 as controlled by AND gate 362.

The ACCEPT signal 270 to network 20 is generated by both initiating and joining nodes for all times except T1 and T2 as inhibited by inverter 272. ACCEPT 270 is generated through OR gate 262 at T3 or T5-T8 READY for times T5 to T8, and at T4 through NAND gate 274, OR gate 278, and AND gate 276. NAND gate 274 detects the presence of any of the GATE OFF signals 121 to 128 as an indication that the T4 decision of NOT COMPARING has been made, while OR gate 278 (COMPARE COMPLETE) detects either that the decision of COMPARE EQUAL or NOT has been reached. The output of gate 278 is ANDED in gate 276 with both T4 and T4 DELAYED in order to prevent any erroneous spikes from passing through gate 276 while gates 110 and 274 are settling out. The generation of the T5-T8 READY signal 412 as generated during T5 and causing the issuing of ACCEPT 270 is described above; however, signal 412 is generated differently during times T6 to T8. At time T6 AND gate 414 and delay block 416 are used in a similar manner as AND gate 276 and delay block 286 are used during time T4 to issue ACCEPT 270 after a COMPARE COMPLETE indication has been received from the byte comparison logic. Likewise, AND gates 454 and 456 work in conjunction with delays blocks 450 and 452 to provide the same function during times T7 and T8, respectively.

The inverse of the local time Register 6 contents (31-bits) are gated onto the network 20 data lines under the control of 4:1 multiplexers 13A to 13 H and inverters 14A to 14 H in groups of 8 bits; i.e., one byte at a time during times T5 to T8 of the GVT operation respectively. Network 20 and the GVT-NET logic work in conjunction during these times T5 to T8 to determine the highest inverse local time amongst all processing nodes by considering one byte at a time starting with the high order byte at time T5. During T5, the high order byte of all the local time registers 6 are driven to network 20 simultaneously. All the high order byte local times 6 are ORed together by network 20 (as shown in FIG. 3), and the OR composite of all high order bits is returned to all nodes by network 20 over individual DATA lines 0 to 7 to each node. The purpose of gates 131 to 138 is to calculate GVT (the minimal of all local times). This is done by comparing the value of the individual byte sent to the network to the byte value received back from the network. This comparison is done in x-or gates 100 to 107. If the high order bit 0 does not compare as detected by x-or 100, NAND gate 121 output goes to 0 and forces all data lines driven to the network to zeroes; in other words, it removes itself from the competition to find GVT. Likewise, if the next high order bit 1 does not compare as detected by x-or 101, NAND gate 122 (not shown) output goes to 0 and forces data lines 1 to 7 driven to the network to zeroes; in other words, it removes itself from the competition to find GVT. Note that is not necessary to remove any high order data bit which compares favorably from driving the network because it is not causing any error in the calculation. Therefore, similar logic is used to remove any discomparing bit and all lower order bits from the calculation. Note that if all 7 high order bits compare and bit 7 does not, that gate 128 will only force DATA LINE 7 to a 0 through gate 138.

Referring to FIG. 13, if the GVT-NET logic detects that after calculating the minimal high byte of GVT (BYTE 1 at time T5), there is a total 8 bit compare amongst the 8 bits that processor node 1 is sending to network 20 and the eight OR composite bits that are being received from network 20 (as detected by XOR gates 100 to 107 and NOR gate 110), the BYTE 1 EQUAL latch 420 is held in the set state at the end of T5 by the LOAD BYTE 1 signal 402. If not, it is reset at this time. Likewise, the BYTE 2 EQUAL latch 422 and the BYTE 3 EQUAL latch 424 are held in the set state or reset at the ends of T6 and T7, respectively, depending on whether there is a total COMPARE EQUAL signal 110 or not. All three BYTE EQUAL signals (420, 422, and 424) are preset to the active state at the end of each previous operation (T8 RESET 360), and are ANDed together in gate 121 to become inputs to the data gates 131 to 138. Thus, gate 121 normally allows data to be sent to network 20 through gates 131 to 138 because it is normally at a 1 level. However, if any byte of the GVT operation fails to COMPARE EQUAL as detected by gate 110, the corresponding BYTE EQUAL latch 420, 422, or 424 gets reset to zero and stays at zero until it is preset at the end of time T8. This prevents all subsequent bytes from participating in the GVT calculation by forcing all data lines to the network to constant zeroes through gates 131 to 138 due to a BYTE EQUAL signal going to a zero into gate 121, which causes gate 121 to go to a zero also.

Thus, the GVT calculation proceeds one byte at a time during times T5 to T8 with each byte being processed in the same manner. The selection of which byte is sent to network 20 at each time is controlled by gates 458 and 460, which are the select signals to Multiplexers 13A to 13H. If the comparison between the data sent to the network and the data received from the network agrees, the node remains in the competition to determine the highest inverse local time value. If any bit of any byte disagrees, the node removes itself completely from the entire calculation (until after time T8) by setting latch 420, 422, or 424, which will drive all zeroes to network 20 from that node. At the end of each time T5 to T8, the byte left active on the network is the highest value from all the nodes of inverse local time. The GVT-NET takes that value byte by byte, inverts it via inverters 15A to 15H, and stores the inverse of the value from the network (lowest of all local times—GVT) into GVT Register 9 at the appropriate time as defined by the LOAD BYTE 1 to 4 signals as generated by gates 402, 404, 406, and 94, respectively. When the calculation is complete at time T8, the complete new 31-bit value of GVT is successfully stored in the GVT Register 9 at all nodes, which have stored the exact same GVT value simultaneously. The GVT-NET logic then informs the processor node 1 that new GVT data has arrived by issuing the NEW GVT READY INTERRUPT as it loads the fourth and final byte into GVT Register 9 through the pulse generated by gate 94. The processor node 1 responds to the NEW GVT READY INTERRUPT by reading the contents of register 9 and receiving the new value of GVT. Note that the comparison during T8 compares only 7 bits to complete the 31-bit GVT value, not the full 8 bits as during the other times. This is controlled by AND gate 470, which gates DATA 7 out of the comparison competition during T8 via inverter 472.

Figure 14:
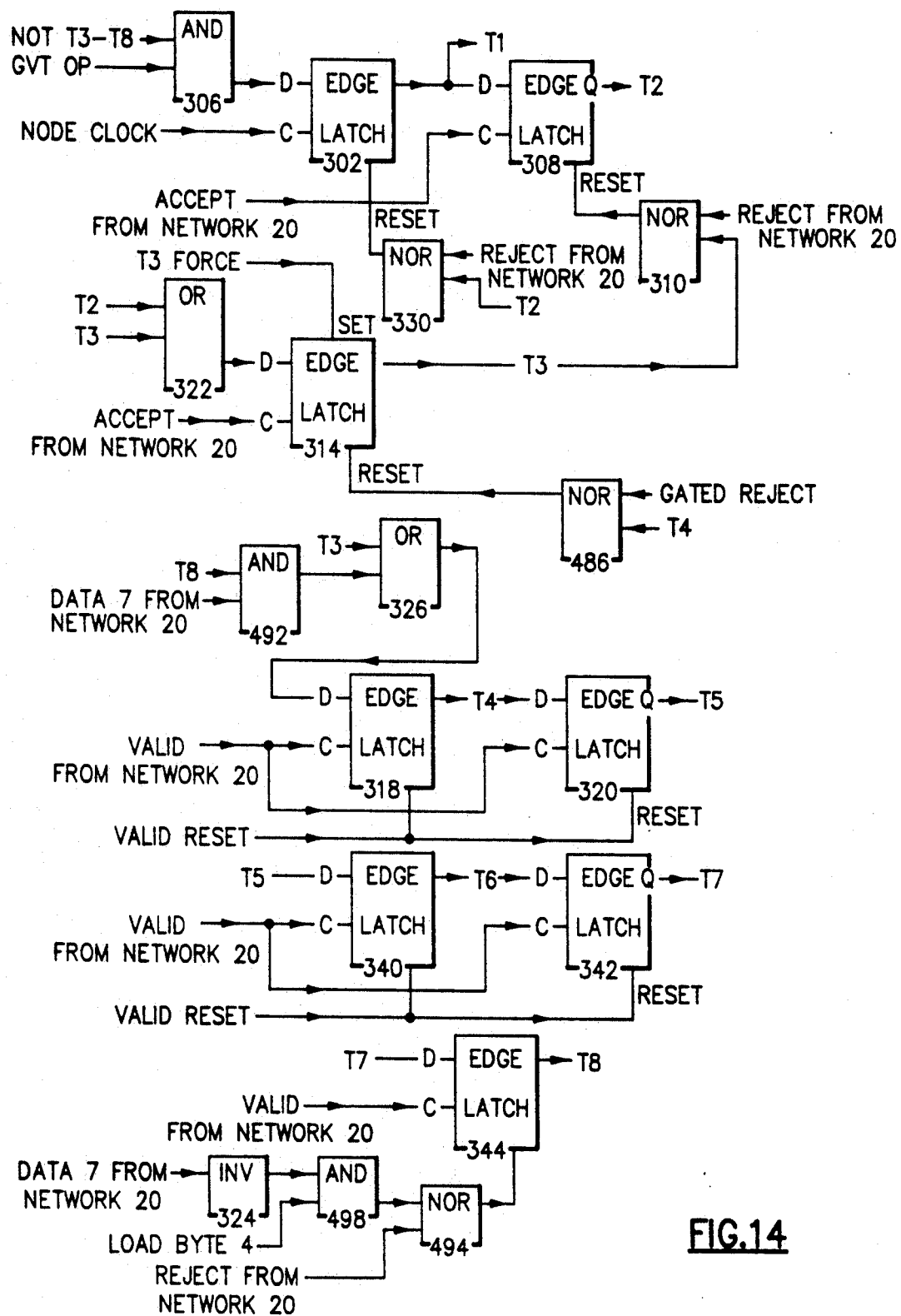
FIG. 14 illustrates the remainder of detailed logic implementation of the preferred embodiment of the GVT-NET function located at each processing node, and in particular shows the control counter functions required.

Referring to FIG. 14, further details of operation counter 52 are shown. The GVT OP signal 56 to AND gate 306 causes T1 latch 302 to set. Latch 302 being set causes T2 latch 308 to set on the subsequent rise of ACCEPT from network 20. Latch 308 setting causes T1 latch 302 to reset via NOR gate 330, and the NOT T3-T5 signal from inverter 484 (FIG. 12) through AND gate 306 prevents latch 302 from setting again as long as any T3 to T8 signal is active.

T2 latch 308 being set causes T3 latch 314 to set through OR gate 322 at the next rise of the ACCEPT signal from network 20. Latch 314 setting causes T2 latch 308 to reset through NOR gate 486. The REJECT from network 20 signal also drives NOR gate 486 and all reset lines in the operation counter 52 for the purposes of resetting the counter if a REJECT is issued by network 20. T3 latch 314 can also be forced to set directly by AND gate 85 (FIG. 12) that causes a force to T3 when a REJECT is detected by a joining node attempting to broadcast during T1 and T2. Thus, T3 reset from NOR gate 486 is generated from the GATED REJECT signal from inverter 490 that allows T3 to be set by a REJECT sent to a joining node rather than reset. T3 latch 314 also is the last T latch clocked with the rise of the ACCEPT signal from the network, and therefore the T3 state must be held until T4 actually gets set at a later time. Thus, Or gate 322 is used to provide a feedback loop to latch 314 that will not allow it to be reset by the rise of the ACCEPT pulse from the network. Instead, T3 latch 314 is reset by the setting of T4 through NOR gate 486.

T3 latch's 314 being set causes T4 latch 318 to set through OR gate 326 at the next rise of the VALID signal from network 20. OR gate 326 is also used to return to T4 from T8 when VALID rises from network 20 and DATA 7 from network 20 is a 1 as detected by AND gate 492. T4 latch 318 is reset by the rise of the VALID signal from network 20 when neither T3 or T8 and DATA 7 are active through AND gate 492 and OR gate 326.

T4 latch 318's being set causes T5 latch 320 to set on the following rise of the VALID signal from network 20. T5 latch 320 is reset by any rise of the VALID signal from network 20 when the T4 signal is not set.

T5 latch's 320 being set causes T6 latch 340 to set on the following rise of the VALID signal from network 20. T6 latch 340 is reset by any rise of the VALID signal from network 20 when the T5 signal is not set.

T6 latch's 340 being set causes T7 latch 342 to set on the following rise of the VALID signal from network 20. T7 latch 342 is reset by any rise of the VALID signal from network 20 when the T6 signal is not set.

T7 latch's 342 being set causes T8 latch 344 to set on the following rise of the VALID signal from network 20. T8 latch 344 is reset by any rise of the VALID signal from network 20 when the T7 signal is not set, or by NOR gate 494 at the termination of a multi-sender operation or set of operations when the VALID signal will not rise again during the operation. In this case, DATA 7 from network 20 is a logical 0 to indicate that the operation is to terminate after T8; this is sensed by inverter 324, which enables AND gate 498 during LOAD BYTE 4 to reset T8 latch 344.

OTHER PREFERRED EMBODIMENTS

Other embodiments which we may prefer to use in certain instances are within the scope of our inventions and will be described by way of example of changes to the preferred embodiment which has been described with reference to the drawings.

For example, the GVT-NET implementation is not restricted to the processing of multiple priority levels. If only one priority level is ever broadcast in a system over the multi-stage network 20, the priority competition of T4 can be eliminated and the operation automatically terminated after the first T8 time. Thus, the operation control counter 52 of FIG. 12 would only ever implement one fixed sequence—that being T1 to T2 to T3 to T5, T6, T7, T8, and terminate.

For example, the GVT-NET implementation is not restricted to two-stage networks. The network selection times, like T1 and T2, may either be increased or decreased depending on the number of stages in the network.

For example, the GVT-NET implementation is not restricted to 31-bit local time and GVT time widths. The local time and GVT Registers 6 and 9 and the number of data lines in network 20 can be varied to permit more or less than four bytes of GVT calculation.

For example, the GVT-NET implementation is not restricted to being commanded by an all ones bit pattern. Any other bit pattern could be chosen. The bit pattern preferably should be equal in width to the network data path width, but this is not mandatory.

For example, the GVT-NET implementation is not restricted to being terminated or continued based on DATA line 7 only. Any other DATA line from the network could be used as easily, or even another line could be added to the network interface to perform this function.

Clearly, the inventions which we have described by way of example and in illustration of our best mode of practicing the inventions, in the various embodiments described, provide a basis for much potential growth. Accordingly, it will be understood that those skilled in the art, both now and in the future, will envision further improvements even by way of invention, and these should be understood to be within the claimed scope which should be construed to protect and preserve the rights of the inventors.

Definition of Terms

ARBITRATION—The act of selecting one winner at a time from a set of multiple contenders.

ARBITRATION SWITCH—A switching apparatus capable of resolving contention amongst several or multiple contenders.

BROADCAST—A specific connection pattern internal to an interconnection network that allows one transmitting element to send and be connected to all receiving elements attached to the network.

BROADCAST COMMANDS OR MESSAGES—Commands or messages that are send via an interconnection network from one transmitting element to all receiving elements.

BROADCAST/SWITCHING APPARATUS—A switching apparatus that has inherent means required to establish BROADCAST connections.

BROADSEND—A multi-sender operation with all nodes participating in a joint operation simultaneously and all nodes sending data to the multi-stage network simultaneously.

DEAD FIELD—the transmission of zeroes on all 8 data lines to the interconnection network for a specific length of time (usually one clock time) by the transmitting element.

GLOBAL VIRTUAL TIME—The lowest of all local time values at given point in time across all of the individual nodes working on a common parallel processing task.

GVT—Abbreviation for Global Virtual Time.

GVT-NET—A hardware apparatus that uses discrete logic at each processing node plus a common interconnection network to calculate the latest GVT value on demand.

GVT CALCULATION—The process of determining which local time value in the system is the lowest value (GVT).

IDLE—The state of a transmitting node, receiving node, or network connection (INPUT PORT or OUTPUT PORT) that has no present transmission or operation in progress.

JOIN—The act of a second or multiple transmitting element establishing a set of programmable connections within a switching apparatus devices comprising a network for the purpose of logically ORing its data into any broadcast or multi-cast operation in progress as started by a first transmitting element.

JOIN COMMAND—The signal sequence transmitted by a transmitting node that enables the node to JOIN the broadcast or multi-cast operation in progress.

JOINING NODE—One of the subsequent transmitting nodes to JOIN a broadcast or multi-cast operation in progress.

INPUT PORT—The connection channel or set of 12 communication signal lines required to connect a transmitting element to an interconnection network or to connect the previous stage of a cascaded switching apparatus to the present stage.

LOCAL TIME—The asynchronous time kept at each individual node that advances without restriction from the other nodes as the local node processor proceeds through its parallel processing tasks.

MULTI-CAST—A specific connection pattern internal to an interconnection network that allows one transmitting element to send and be connected to a subset of receiving elements attached to the network.

MULTI-CAST COMMANDS OR MESSAGES—Commands or messages that are send via an interconnection network from one transmitting element to a subset of receiving elements.

MULTI-SENDER—A connection or operation supported over an interconnection network that permits data from several or multiple transmitting elements to be logically ORed in the network and simultaneously sent to one, several, or multiple receiving elements.

MULTI-SENDER/SWITCHING APPARATUS—A switching apparatus which has the inherent means required to perform multi-sender operations and establish multi-sender connections involving logical ORing of the data sent by multiple transmitting nodes.

NETWORK—A multiplicity of switching apparatus devices interconnected in a fixed pattern for the purpose of interconnecting multiple system elements and permitting the system elements to exchange communication commands and messages.

NETWORK ARBITRATION—A single joint operation performed over the network and involving all attached nodes. The network and all nodes perform jointly to calculate the network requestor having the the high priority operation pending at any given time and give the usage of the network to that requestor as the arbitration winner of the network facilities.

NETWORK REQUESTOR—Any node wishing to use the network for sending or processing a pending operation over the network.

NODE—A device or system element attached to an interconnection network. (Used interchangeably with system element.)

OUTPUT PORT—The connection channel or set of (12) communication signal lines required to connect an interconnection network to a receiving element or to connect the next stage of a cascaded switching apparatus to the present stage.

PATH SELECTION—The act of programming the switching apparatus to select a specific path or route through the interconnection network for the purpose of interconnecting two or more system elements via the network.

PENDING OPERATION—An operation that has been started at a node or system element and is waiting for the usage of the network facilities to complete the operation.

POINT to POINT—a connection having one and only one transmitter and one and only one receiver.

PROCESSOR NODE—A node or system element having computational power.

PROCESSING NODE—A node or system element having computational power.

RECEIVING ELEMENT or NODE—A system element attached as a node to an interconnection network that has the capability of receiving commands or messages from the network.

STANDARD OPERATION—An connection through the network for connecting one and only one transmitting element to one and only one receiving element.

SWITCHING APPARATUS—The circuit element comprising an interconnection network that provides programmable connection links allowing the network to instantaneously make and break a variety of interconnection patterns without having to physically change any interconnection wires.

TRANSMITTING ELEMENT or NODE—A system element attached as a node to an interconnection network that has the capability of sending commands or messages to the network. A element which is capable both transmitting and receiving will be referred to as a transmitting element when in the act of sending to the network and referred to as a receiving element when it is in act of receiving from the network.

What is claimed is:

1. A multi-stage interconnection network and Global Virtual Time apparatus (GVT-NET), jointly functioning in a system having n processor nodes, comprising:
   a plurality of transmitting elements;
   a plurality of receiving elements;
   a multi-sender switch apparatus means comprising a network for coupling said elements asynchronously through input to output port connections for establishing point to point input to output port connections, single input to multiple or all output port connections, and multiple or all input port connections to multiple or all output port connections;
   a GVT-NET apparatus located at every system element and comprised of identical functions at each element including:
   a local time register;
   a global virtual time register;
   a GVT-NET control function;
   a normal network traffic control function;
   a data selection multiplexer for selecting various data sources for transmission of data to the said network.

2. The apparatus of claim 1 wherein the said GVT-NET and said network provide means for calculating GVT fast and accurately by requiring each individual system element to transmit its own unique local time value to the said network simultaneously with all other system elements, to subsequently compare the local time value sent to the network to the composite value received back from the said network which is the logical OR of all the individual local times sent to the said network, to continue to transmit the local time value to the said network if there is an identical compare detected or to change the transmission to all zeroes if there is not an identical compare detected, and finally to receive the final composite value from the network as the latest GVT value independent of whether each particular system element is transmitting all zeroes or the local time value to the said network.

3. The apparatus of claim 1 wherein the said GVT-NET apparatus provides a means whereby the GVT-NET works jointly with a node processor to respond individually to every joint calculation over the said network.

4. The apparatus of claim 1 wherein the GVT-NET interrupts a processing node and requests information, pertinent to a joint calculation.

5. The apparatus of claim 1 wherein a node processor provides requested data to the GVT-NET which in turn supplies the said data to the network for the purpose of performing a joint calculation.

6. The apparatus of claim 1 wherein the said GVT-NET apparatus provides a means enabling the local time register and the Global Virtual Time register.

7. The apparatus of claim 2 wherein the said GVT-NET apparatus provides a means for performing GVT calculations in a sequence of individual sub-calculations, and wherein each sub-calculation processes a portion of an entire GVT value, and the sub-calculations are combined to provide the correct over-all result for GVT, as if the calculation was all performed in one disjointed operation.

8. The apparatus of claim 2 wherein the said apparatus provides a means for continuing a multi-sender mode of operation established by a GVT-NET operation to perform further operations without breaking the existing network connections.

9. The apparatus of claim 2 wherein the said GVT-NET apparatus provides a means for using the network to find the minimum LOCAL TIME at any moment by polling all n processor nodes and then causing the new value of GVT to be loaded into all n processors simultaneously.

10. The apparatus of claim 2 wherein the said GVT-NET apparatus provides a means for using a maximizing network calculation circuit to perform a minimizing calculation by inverting the inputs and outputs.

11. The apparatus of claim 2 wherein the said GVT-NET apparatus provides a means for controlling a GVT calculation with one common set of logic which is adaptable to be used at a processor requesting the GVT calculation and at processors not requesting the GVT calculation and still cause them all to work together to provide the final result of calculating a new GVT value.

12. The apparatus of claim 2 wherein the said apparatus provides a means for enabling all system elements to function jointly and simultaneously in one common operation involving every element and network facility to calculate the highest priority network requestor and to grant the said highest priority requestor the immediate usage of network facilities.

13. The apparatus of claim 2 wherein the said network provides a means for enabling all system elements connected to network facilities to use the facilities of the said network to perform GVT calculations as commanded from any of the said system elements.

14. The apparatus of claim 2 wherein the said network provides a means for enabling all said system elements to contribute to one joint GVT calculation and a means for all said system elements to receive the result of the said joint GVT calculation simultaneously and identically.

15. The apparatus of claim 2 wherein the said network provides a means for enabling all the said system elements to transmit a data bit pattern simultaneously and to use network facilities to logically OR the said data bit patterns and to provide the result back to all said system elements simultaneously.

16. The apparatus of claim 2 wherein the said network provides a means for handling GVT calculations performed in the said network consistently and compatibly over any number of network stages.

17. The apparatus of claim 7 wherein the GVT-NET apparatus provides a means for affecting a compare required as part of a sub-calculation of GVT based on the results of a previous sub-calculation, such that a previous discompare will cause all subsequent compare sub-calculations to discompare.

18. The apparatus of claim 7 wherein the said network provides a means for enabling all said elements to receive a positive indication via a composite ACCEPT signal that joint GVT sub-calculations and the said over-all GVT result has been completed by all the means for performing and the system elements.

19. The apparatus of claim 8 wherein the means for continuing multi-sender operations after the present operation is based on the value (1or 0) transmitted on a predefined data line to and from the said network during the final portion of the said present operation over the said network.

20. The apparatus of claim 8 wherein a data line to the said network is driven to a logical 1 from every system element that wishes to continue the multi-sender operations and to a 0 from every system element that wishes to terminate the multi-sender operations.

21. The apparatus of claim 8 wherein the network performs a logical OR on all data transmitted to it from all the said system elements, and sends the composite OR value to all the said system elements.

22. The apparatus of claim 8 wherein a logical one dominates an OR function over the said network, so that if one or more system elements wish to continue multi-sender operations, all the said system elements will see a logical 1 on a composite OR data line from the said network and will continue the multi-sender operations.

23. The apparatus of claim 8 wherein if none of the said system elements wish to continue multi-sender operations, all the said-system elements will see a logical 0 on the said composite Or data line from the said network and will terminate the multi-sender operations.

24. The apparatus of claim 11 wherein the said GVT-NET apparatus provides a means whereby the initiating requestor may not become the first or next highest priority requester and continues to control all the sequencing of the joint calculations until all joint calculations are exhausted.

25. The apparatus of claim 12 wherein a subsequent second highest priority requestor is granted the immediate usage of the said network facilities after the first highest priority requestor has finished using the network facilities and without changing the network connections previously established for said first highest priority requestor.

26. The apparatus of claim 12 wherein the system elements which are not high priority requestors withdraw from the present priority calculation, keep their individual requests pending, keep the network connections from changing, and continue to participate in subsequent priority calculations involving all the said system elements and network facilities until they become the high priority requestors and are granted the immediate usage of the said network facilities.

27. The apparatus of claim 12 wherein the said highest priority requestor is the GVT-NET or multiple numbers of GVT-NETs all simultaneously requesting GVT calculations, and in either said case the one or several requestors will all jointly use the network facilities simultaneously as multi-senders involved in the same and simultaneous immediate usage of the said network facilities.

28. The apparatus of claim 18 wherein the network provides a means for ANDing individual calculation complete indications in the form of individual ACCEPT lines from all said system elements to form the said composite ACCEPT signal and then to send it simultaneously or at about the same time to all system elements so that all system elements receive a consistent indication that the joint GVT sub-calculations and the over-all GVT result have been completed.

29. The apparatus of claim 27 wherein the said multiple highest priority GVT-NET requestors are all simultaneously satisfied by the single and immediate usage of the said network facilities and all said highest priority requestors withdraw their present request for the usage of the said network upon being satisfied.

* * * * *